US009530915B2

(12) United States Patent
Saito

(10) Patent No.: US 9,530,915 B2
(45) Date of Patent: Dec. 27, 2016

(54) SOLAR PANEL AND TIMEPIECE INCLUDING SOLAR PANEL

(71) Applicant: CASIO COMPUTER CO., LTD., Shibuya-ku, Tokyo (JP)

(72) Inventor: Yuta Saito, Kokubunji (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 14/912,860

(22) PCT Filed: Sep. 2, 2014

(86) PCT No.: PCT/JP2014/073598
§ 371 (c)(1),
(2) Date: Feb. 18, 2016

(87) PCT Pub. No.: WO2015/034077
PCT Pub. Date: Mar. 12, 2015

(65) Prior Publication Data
US 2016/0204292 A1   Jul. 14, 2016

(30) Foreign Application Priority Data

Sep. 4, 2013  (JP) .................................. 2013-182755
Mar. 13, 2014  (JP) .................................. 2014-050244

(51) Int. Cl.
*G04C 10/02*   (2006.01)
*H01L 31/042*   (2014.01)
*H01L 31/0465*   (2014.01)

(52) U.S. Cl.
CPC ............. *H01L 31/042* (2013.01); *G04C 10/02* (2013.01); *H01L 31/0465* (2014.12); *Y02E 10/50* (2013.01)

(58) Field of Classification Search
CPC .... G04C 10/02; H01L 31/042; H01L 31/0463; H01L 31/0465

(Continued)

(56) References Cited

U.S. PATENT DOCUMENTS 3,427,797 A * 2/1969 Negoro .................. G04C 10/02
136/249
3,786,624 A * 1/1974 Uchiyama .............. G04C 10/02
136/244

(Continued)

FOREIGN PATENT DOCUMENTS

JP           10039057 A       2/1998
JP         2012202931 A      10/2012

OTHER PUBLICATIONS

International Search Report (ISR) and Written Opinion (WO) dated Nov. 28, 2014 issued in International Application No. PCT/JP2014/073598.

*Primary Examiner* — Vit W Miska
(74) *Attorney, Agent, or Firm* — Holtz, Holtz & Volek PC

(57) ABSTRACT

A solar panel of the present invention, above which pointers mounted on a pointer shaft inserted into a through hole provided at the center of the solar panel move, includes a center cell circularly formed around the through hole and a plurality of outer-circumferential cells formed around the outer periphery of the center cell in a manner to have substantially same light-receiving areas. The center cell is formed to have a light-receiving area larger than the light-receiving area of each outer-circumferential cell, taking into consideration a light-shielding area where the pointers overlap with the center cell. Therefore, even though the pointers always overlap with the center cell and part of the pointers overlaps with one of the plurality of outer-circumferential cells, the fluctuation of each light-receiving area of the (Continued)

center cell and the plurality of outer-circumferential cells due to this overlap can be minimized.

10 Claims, 12 Drawing Sheets

(58) Field of Classification Search
USPC .......................................................... 368/205
See application file for complete search history.

(56) References Cited

U.S. PATENT DOCUMENTS

| | | | | |
|---|---|---|---|---|
| 3,890,776 | A * | 6/1975 | Urushida | G04C 3/008 |
| | | | | 136/244 |
| 6,122,226 | A * | 9/2000 | Murakami | G04C 10/02 |
| | | | | 368/205 |
| 6,521,822 | B2 * | 2/2003 | Ito | G04C 10/02 |
| | | | | 136/244 |
| 2013/0258822 | A1 * | 10/2013 | Takenawa | H01L 31/042 |
| | | | | 368/205 |

* cited by examiner

SOLAR PANEL AND TIMEPIECE INCLUDING SOLAR PANEL

TECHNICAL FIELD

The present invention relates to a solar panel that is used in a pointer-type timepiece such as a wristwatch or a pointer-type measuring instrument such as a meter, and a timepiece including the solar panel.

BACKGROUND ART

For example, a solar panel for use in a wristwatch is known in which a plurality of solar cells each formed into a fan shape so as to have an equal area are circularly arranged and connected in series, as described in Patent Document 1.

PRIOR ART DOCUMENT

Patent Document

Patent Document 1: JP 10-039057

This type of solar panel is structured to have a through hole provided in its center and a pointer shaft inserted in the through hole to protrude upward. On the upper end of the pointer shaft, a pointer is mounted, and moves above the plurality of solar cells.

In this type of solar panel, the value of output current obtained by the plurality of solar cells as a whole becomes equal to the value of the smallest output current obtained by one of the plurality of solar cells due to electrical characteristics of a diode or the like. Accordingly, when the pointer is positioned over one of the plurality of solar cells, the light-receiving area of the solar cell over which the pointer has been positioned becomes smaller than the light-receiving areas of the other solar cells.

As a result, the output current of the solar cell over which the pointer has been positioned becomes smaller than the output currents of the other solar cells, and the value of the output current obtained by the plurality of solar cells as a whole becomes equal to this smallest output current of the solar cell. Thus, there is a problem in this solar panel in that a loss of the output current of the plurality of solar cells as a whole is disadvantageously large.

SUMMARY OF INVENTION

The present invention is to provide a solar panel and a timepiece capable of minimizing the fluctuations of light-receiving areas due to pointers and substantially equalizing the light-receiving amounts of cells, and thereby maximally improve output currents.

In order to achieve the above-described object, in accordance with one aspect of the present invention, there is provided a solar panel where a pointer shaft is inserted into a through hole provided at center of the solar panel and pointers mounted on the pointer shaft move above the solar panel, comprising: a center cell formed around periphery of the through hole; and a plurality of outer-circumferential cells formed around outer periphery of the center cell in a manner to have substantially same light-receiving areas, wherein the center cell is formed to have a light-receiving area larger than each light-receiving area of the plurality of outer-circumferential cells, taking into consideration a light-shielding area where the pointers overlap with the center cell.

In accordance with another aspect of the present invention, there is provided a timepiece comprising: a solar panel where a pointer shaft is inserted into a through hole provided at center of the solar panel and pointers mounted on the pointer shaft move above the solar panel, wherein the solar panel includes a center cell formed around periphery of the through hole, and a plurality of outer-circumferential cells formed around outer periphery of the center cell in a manner to have substantially same light-receiving areas, and wherein the center cell is formed to have a light-receiving area larger than each light-receiving area of the plurality of outer-circumferential cells, taking into consideration a light-shielding area where the pointers overlap with the center cell.

BRIEF DESCRIPTION OF DRAWINGS

FIG. 2A to FIG. 2C depict pointers of the timepiece module depicted in FIG. 1, of which FIG. 2A is an enlarged front view of a second hand, FIG. 2B is an enlarged front view of a minute hand, and FIG. 2C is an enlarged front view of an hour hand;

FIG. 11A and FIG. 11B depict a sixth embodiment of the present invention applied to a pointer-type wristwatch, of which FIG. 11A is an enlarged front view of a timepiece module, and FIG. 11B is an enlarged front view of a solar panel of the timepiece module; and FIG. 12A and FIG. 12B depict a seventh embodiment of the present invention applied to a pointer-type wristwatch, of which FIG. 12A is an enlarged front view of a timepiece module, and FIG. 12B is an enlarged front view of a solar panel of the timepiece module.

DESCRIPTION OF EMBODIMENTS

First Embodiment

A first embodiment in which the present invention has been applied to a pointer-type wristwatch will hereinafter be described with reference to FIG. 1 to FIG. 4.

Figure 1:
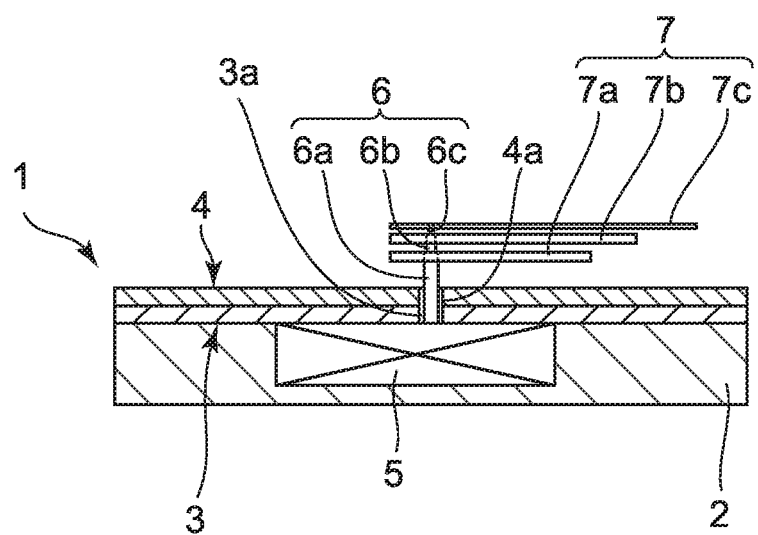
FIG. 1 is an enlarged sectional view of a timepiece module in a first embodiment in which the present invention has been applied to a pointer-type wristwatch.

This pointer-type wristwatch includes a timepiece module 1 as depicted in FIG. 1.

The timepiece module 1, which is arranged in a wristwatch case (not depicted), has a housing 2.

On the upper surface of the housing 2, a solar panel 3 is arranged, and a dial plate 4 is arranged on the upper surface of this solar panel 3, as depicted in FIG. 1. Inside the housing 2, a timepiece movement 5 is provided. The timepiece movement 5 is structured to move pointers 7 such as an hour hand 7a, a minute hand 7b, and a second hand 7c by rotating a pointer shaft 6.

In this embodiment, the dial plate 4 is constituted by a transparent or semitransparent film, and formed into a substantially circular shape. On peripheral portions on the upper surface of the dial plate 4, time characters (not depicted in the drawing) are provided at predetermined spacing. The pointer shaft 6 has a cylindrical hour-hand shaft 6a, a cylindrical minute-hand shaft 6b rotatably arranged in the hour hand shaft 6a, and a second-hand shaft 6c rotatably arranged in the minute-hand shaft 6b, as depicted in FIG. 1.

This pointer shaft 6 is structured to protrude above the dial plate 4 via a through hole 3a provided in the center of the solar panel 3 and a through hole 4a provided in the center of the dial plate 4, as depicted in FIG. 1. The pointers 7 are respectively mounted on an upper end of the pointer shaft 6, as depicted in FIG. 1 and FIG. 2A to FIG. 2C.

That is, the hour hand 7a is mounted on the upper end of the hour-hand shaft 6a, the minute hand 7b is mounted on the upper end of the minute-hand shaft 6b, and the second-hand 7c is mounted on the upper end of the second-hand shaft 6c, as depicted in FIG. 1 and FIG. 2A to FIG. 2C. As a result, the timepiece movement 5 is structured to move the pointers 7 including the hour hand 7a, the minute hand 7b, and the second hand 7c above the dial plate 4 by rotating the pointer shaft 6 including the hour-hand shaft 6a, the minute-hand shaft 6b, and the second-hand shaft 6c to.

Figures 2A, 2B, 2C:
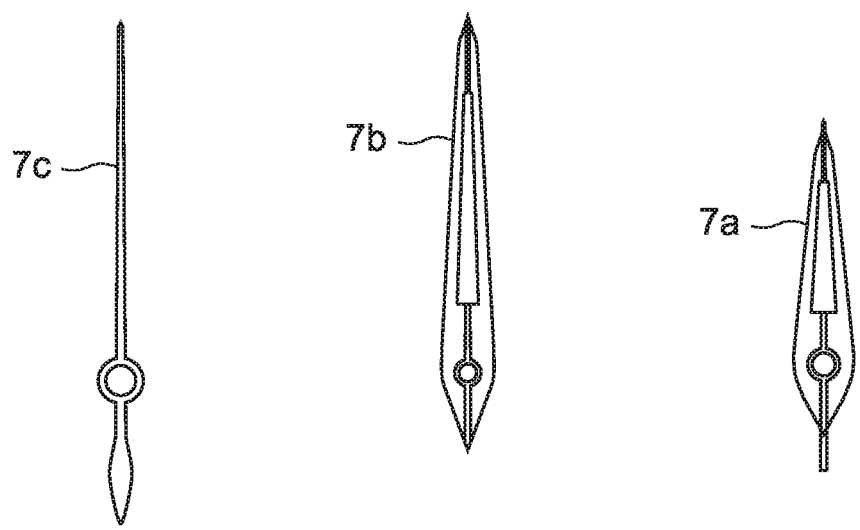

In this embodiment, among the hour hand 7a, the minute hand 7b, and the second hand 7c, the minute hand 7b is formed to have the largest surface area as compared with those of the hour hand 7a and the second hand 7c, as depicted in FIG. 2A to FIG. 2C. That is, the minute hand 7b is formed such that its length is longer than that of the hour hand 7a and substantially equal to that of the second hand 7c, and its width (the length in the direction orthogonal to the longitudinal direction) is slightly narrower (shorter) than that of the hour hand 7a and wider (longer) than that of the second hand 7c.

Figure 3:
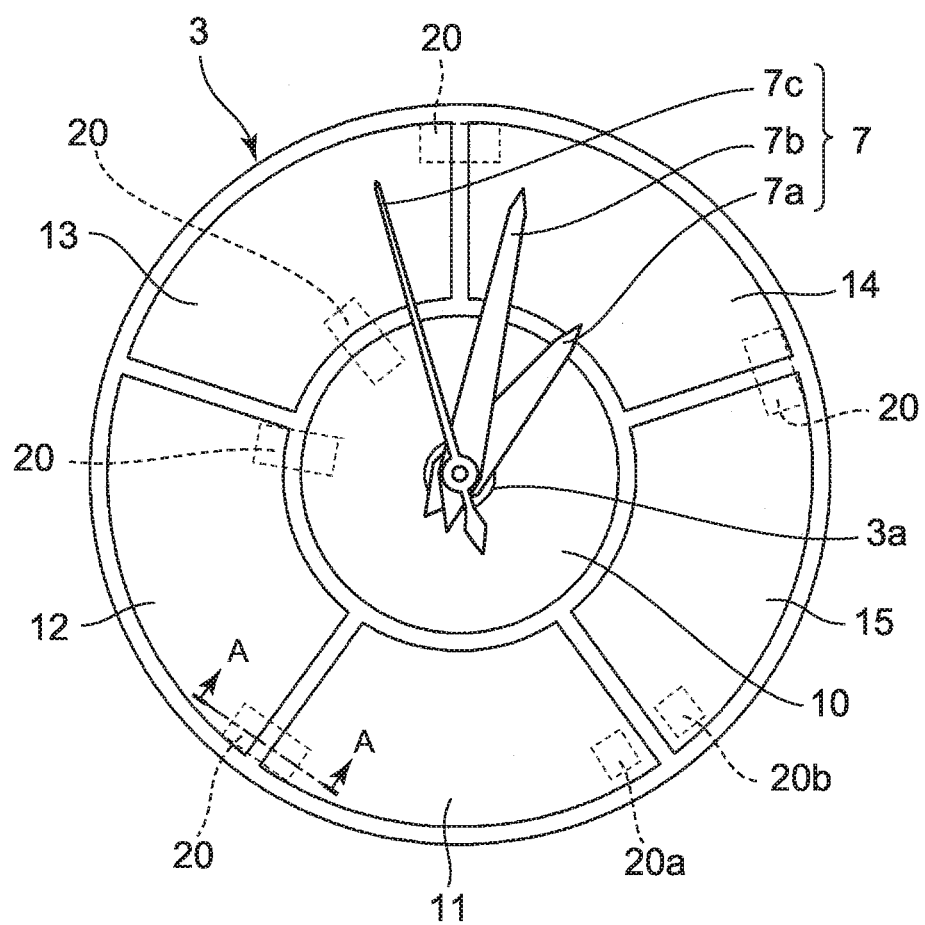
FIG. 3 is an enlarged front view of a solar panel of the timepiece module depicted in FIG. 1.

The solar panel 3 is formed into a circular shape, which is substantially equal in size to the dial plate 4, as depicted in FIG. 1 and FIG. 3. This solar panel 3 has a center cell 10 formed into a circular shape centering on the through hole 3a provided at the center, and a plurality of outer-circumferential cells 11 to 15 formed around the periphery of the center cell 10 and having light-receiving areas of substantially the same size. The center cell 10 and the plurality of outer-circumferential cells 11 to 15 are arranged in a circular shape on the upper surface of a film substrate 8, centering on the through hole 3a, as depicted in FIG. 3 and FIG. 4.

Figure 4:
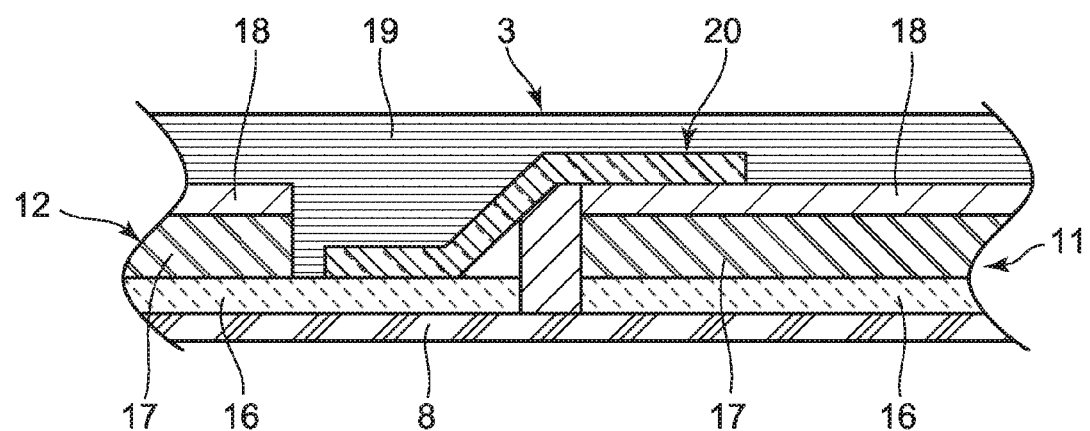
FIG. 4 is an enlarged sectional view of a connecting section of the solar panel taken along line A-A in FIG. 3.

In this embodiment, the center cell 10 and the plurality of outer-circumferential cells 11 to 15 are each structured to have a lower electrode 16 made of metal such as aluminum and formed on the film substrate 8 by patterning, a power generation layer 17 constituted by a semiconductor layer made of amorphous silicon (a-Si) or the like and formed on the lower electrode 16 by patterning, a transparent upper electrode 18 made of ITO (Indium Tin Oxide) or the like and formed on the power generation layer 17 by patterning, and a protective film 19 made of transparent insulating synthetic resin and covering the upper electrode 18, as depicted in FIG. 4.

As a result, the center cell 10 and the plurality of outer-circumferential cells 11 to 15 are structured such that, when external light passes through the dial plate 4 and applied to the power generation layer 17 via the transparent upper electrode 18, the power generation layer 17 generates an electromotive force, as depicted in FIG. 1 and FIG. 4.

The shapes and sizes of the center cell 10 and the plurality of outer-circumferential cells 11 to 15 are formed such that their light-receiving amounts are substantially equal to each other, as depicted in FIG. 3. That is, the center cell 10 is formed such that its light-receiving area is larger than the light-receiving area of each of the plurality of outer-circumferential cells 11 to 15, taking into consideration a light-shielding area where the pointers 7 overlap with the center cell 10. That is, the center cell 10 is formed such that its light-receiving area is larger than the light-receiving area of each of the plurality of outer-circumferential cells 11 to 15 by an approximately average light-shielding area between maximum and minimum light-shielding areas where the pointers 7 overlap with the center cell 10.

In this case, the maximum light-shielding area where the pointers 7 overlap with the center cell 10 is the area of a portion that is shaded by the pointers 7 when the hour hand 7a, the minute hand 7b, and the second hand 7c are separately positioned above the center cell 10 without overlapping with each other, as depicted in FIG. 3. Also, the minimum light-shielding area where the pointers 7 overlap with the center cell 10 is the area of a portion that is shaded by the pointers 7 when the hour hand 7a, the minute hand 7b, and the second hand 7c are positioned above the center cell 10 with them overlapping with each other.

The plurality of outer-circumferential cells 11 to 15 are formed having the same fan shape and the same size, as depicted in FIG. 3. Specifically, the plurality of outer-circumferential cells 11 to 15 are each formed having a light-receiving area smaller than the light-receiving area of the center cell 10 by the light-shielding area where the pointers 7 overlap with the center cell 10, that is, the approximately average light-shielding area between the maximum and minimum light-shielding areas formed by the pointers 7.

These outer-circumferential cells 11 to 15 are structured such that the hour hand 7a of the pointers 7 hardly overlap with each area of the outer-circumferential cells 11 to 15 and the tips of the minute hand 7b and the second hand 7c selectively overlap therewith. Accordingly, the center cell 10 is formed having a large light-receiving area in order to stably receive most of the shade given by the pointers 7, and the plurality of outer-circumferential cells 11 to 15 are formed having the same light-receiving area because they are hardly influenced by the shade given by the pointers 7.

Also, the center cell 10 and the plurality of outer-circumferential cells 11 to 15 are sequentially connected in series by a plurality of connecting sections 20, as depicted in FIG. 3 and FIG. 4. These connecting sections 20 are each made of conductive paste, and electrically connect the lower electrode 16 of each cell 10 to 15 and the upper electrode 18 of each cell 10 to 15 adjacent thereto together.

In this embodiment, the plurality of connecting sections 20 are preferably provided in areas that do not serve as light-receiving areas, such as the areas of characters indicating hours and print marks on the dial plate 4. For example, the outer-circumferential cell 11 and the outer-circumferential cell 12 adjacent thereto are connected to each other by the connecting section 20 at their outer circumferential portions, as depicted in FIG. 3. This outer-circumferential cell 12 and the center cell 10 are also connected to each other by the connecting section 20.

Similarly, the center cell 10 and the outer-circumferential cell 13 are connected to each other by the connecting section 20, as depicted in FIG. 3. This outer-circumferential cell 13 and the outer-circumferential cell 14 adjacent thereto are also connected to each other by the connecting section 20 at their outer circumferential portions. The outer-circumferential cell 14 and the outer-circumferential cell 15 adjacent thereto are also connected to each other by the connecting section 20 at their outer circumferential portions.

In this embodiment, among the center cell 10 and the plurality of outer-circumferential cells 11 to 15, two outer-circumferential cells 11 and 15 positioned at the last end are not connected to each other by the connecting section 20, as depicted in FIG. 3. The upper electrode 18 of one outer-circumferential cell 11 is connected to an output terminal 20a positioned at its outer-circumferential portion, and the lower electrode 16 of the other outer-circumferential cell 15 is connected to an output terminal 20b positioned at its outer-circumferential portion.

This pair of output terminals 20a and 20b is structured to be connected to a pair of input electrodes (not depicted in the drawings) of the timepiece module 1. As a result, the solar panel 3 is structured to supply generated electric power to a chargeable battery (not depicted in the drawings) of the timepiece 1.

Next, the operation of the above-structured pointer-type wristwatch is described.

Normally, by electric power being supplied to the timepiece movement 5, the timepiece movement 5 operates to rotate the pointer shaft 6, and the pointers 7 such as the hour hand 7a, the minute hand 7b, and the second hand 7c move above the dial plate 4 with the rotation of the pointer shaft 6 so as to indicate the time.

Here, external light such as sunlight is applied to the dial plate 4, and the applied external light passes through the dial plate 4 to be applied to the cells 10 to 15 of the solar panel 3. Then, the applied external light passes through the transparent protective film 19 and the transparent upper electrode 18 of each of the cells 10 to 15 to be applied to each power generation layer 17, and each power generation layer 17 generates electric power by using this applied light.

That is, when external light is applied, the power generation layer 17 of each of the plurality of outer circumferential cells 11 to 15 and the center cell 10 generates electromotive force in accordance with the light application amount. By the cells 10 to 15 being connected in series by the connecting sections 20, the generated electromotive force is sent from each of the output terminals 20a and 20b of the outer-circumferential cells 11 and 15 at the last end to the chargeable battery (not depicted in the drawings) of the timepiece module 1 for charging.

As such, even if part of external light applied to the solar panel 3 is shielded by the pointers 7 moving above the dial plate 4 when the solar panel 3 generates electric power, the center cell 10 and the plurality of outer-circumferential cells 11 to 15 substantially equally generate electric power and output stable electric power, as depicted in FIG. 3.

That is, among the center cell 10 and the plurality of outer-circumferential cells 11 to 15, in the area above the center cell 10, the three pointers 7, that is, the hour hand 7a, the minute hand 7b, and the second hand 7c move while constantly overlapping with the center cell 10. However, taking into consideration this overlap of the pointers 7, the light-receiving area of the center cell 10 is formed larger than the light-receiving area of each of the plurality of outer-circumferential cells 11 to 15. Accordingly, the light-receiving area of the center cell 10 is substantially equal to the light-receiving area of each of the plurality of outer-circumferential cells 11 to 15.

Here, one or both of the tips of the minute hand 7b and the second hand 7c overlap with one of the plurality of outer-circumferential cells 11 to 15. Therefore, the light-receiving area of a portion of the outer-circumferential cells 11 to 15 with which the tips of the minute hand 7b and the second hand 7c have overlapped is slightly decreased. As a result, the fluctuations of the light-receiving areas of the center cell 10 and the plurality of outer-circumferential cells 11 to 15 due to the overlap of the pointers 7 can be minimized.

Thus, the light-receiving amounts of all of the cells 10 to 15, that is, the light-receiving amounts of the center cell 10 and the plurality of outer-circumferential cells 11 to 15 are substantially equalized. As a result, an output current from the entire solar panel 3 is acquired while being stabilized at a high value, irrespective of the positions of the pointers 7. That is, the value of current to be outputted from the entire solar panel 3 can be maximized.

In this case, the shape of the center cell 10 with the minimum circumference is a circle when the area is the same, and the area of the center cell 10 is larger than the area of each of the outer-circumferential cells 11 to 15. Therefore, compared with existing cells obtained by equally and radially dividing a circle, the total length of dividing lines required for the cells 10 to 15 is shorter than the total length of the dividing lines of the existing cells. As a result, the area of each of the cells 10 to 15 required for the division is decreased and a larger light-receiving area can be acquired.

For example, when the radius of the solar panel 3 is R, the radius of the center cell 10 is X, and the number of divisional cells 10 to 15 is S, if $$X < R/2 \cdot \pi - S + 1)$$ Equation 1 is set, the total length of the dividing lines of the cells 10 to 15 is decreased.

That is, in the case where the number of the divisional cells 10 to 15 is six, Equation 1 described above is satisfied when (X/R) is smaller than $(1/(2\pi-5))$.

Here, the center cell 10 is larger than each of the outer-circumferential cells 11 to 15. Therefore, (X/R) is larger than $(1/\sqrt{6})$. Accordingly, the light-receiving area can be increased in the range of $(1/\sqrt{6}) < (X/R) < (1/(2\pi-5))$.

Note that, when the number of the divisional cells is five, the light-receiving area of the center cell is larger than each of the four outer-circumferential cells. Accordingly, the total length of the dividing lines of the cells is increased, and Equation 1 described above is not satisfied, contrary to the above-described case. As a result, the area of each outer-circumferential cell is larger than the area of the center cell, which causes a loss in light-receiving amount.

As such, the solar panel 3 of this pointer-type wristwatch includes the center cell 10 formed in a circular shape centering on the through hole 3a at the center where the pointer shaft 6 is inserted and the plurality of outer-circumferential cells 11 to 15 formed around the outer periphery of the center cell 10 and having light-receiving areas of a substantially equal size, and the light-receiving area of the center cell 10 is formed larger than the light-receiving area of each of the plurality of outer-circumferential cells 11 to 15, taking into consideration the light-shielding area where the pointers 7 mounted on the pointer shaft 6 overlap with the center cell 10. As a result, the fluctuation of the light-receiving area of each cell 10 to 15 due to the pointers 7 can be minimized, the light-receiving amounts of the cells 10 to 15 can be substantially equalized, and output currents can be maximally improved.

That is, according to this solar panel 3, even in the case where the pointers 7 always overlap with the center cell 10 and part of the pointers 7 overlaps with one of the plurality of outer-circumferential cells 11 to 15 when the pointers 7 move above the center cell 10 and the plurality of outer-circumferential cells 11 to 15, the fluctuations of the light-receiving areas of the center cell 10 and the plurality of outer-circumferential cells 11 to 15 due to this overlap can be minimized.

Therefore, the light-receiving amounts of the center cell 10 and the plurality of outer-circumferential cells 11 to 15 can be substantially equalized. Accordingly, the output current of the cells 10 to 15 as a whole can be stabilized at a high value, irrespective of the positions of the pointers 7. As a result, the output current of the cells 10 to 15 as a whole can be maximally improved.

In this case, the light-receiving area of the center cell 10 is formed larger than the light-receiving area of each of the plurality of outer-circumferential cells 11 to 15 by the approximately average light-shielding area between the maximum and minimum light-shielding areas where the pointers 7 overlap with the center cell 10. Therefore, even in the case where the pointers 7 always overlap with the center cell 10 and the center cell 10 is light-shielded, the light-receiving amount of the center cell 10 and the light-receiving amount of each of the plurality of outer-circumferential cells 11 to 15 can have a substantially same value.

Accordingly, even when part of the pointers 7 overlaps with one of the plurality of outer-circumferential cells 11 to 15, the fluctuations of the light-receiving areas of the center cell 10 and the plurality of outer-circumferential cells 11 to 15 due to this overlap can be minimized. Therefore, the light-receiving amounts of the center cell 10 and the plurality of outer-circumferential cells 11 to 15 can be substantially equalized, irrespective of the positions of the pointers 7.

Also, in the solar panel 3, the center cell 10 and the plurality of outer-circumferential cells 11 to 15 are connected to each other in series by the connecting sections 20. As a result, the solar panel 3 is resistant to the influence of the pointers 7, and can minimize the fluctuations of the light-receiving areas of the center cell 10 and the plurality of outer-circumferential cells 11 to 15 and efficiently supply electric power generated at the center cell 10 and the plurality of outer-circumferential cells 11 to 15 to the timepiece module 1.

Second Embodiment

Next, a second embodiment of the present invention applied to a pointer-type wristwatch is described with reference to FIG. 5. Note that sections identical to those of the first embodiment depicted in FIG. 1 to FIG. 4 are provided with the same reference numerals for description.

This pointer-type wristwatch has a structure identical to that of the first embodiment except that it has a display window section 26 which is a non-light-receiving area and provided to a solar panel 25.

In this embodiment as with the first embodiment, the solar panel 25 is formed in a circular shape substantially equal in size to the dial plate 4. This solar panel 25 has a center cell 27 formed in a circular shape centering on a through hole 25*a* provided at the center, and a plurality of outer-circumferential cells 28 to 32 formed around the periphery of the center cell 27 and having light-receiving areas of a substantially same size.

In this embodiment as well, the shapes and sizes of the center cell 27 and the plurality of outer-circumferential cells 28 to 32 are formed such that their light-receiving amounts are substantially equal to each other, as with the first embodiment. That is, the light-receiving area of the center cell 27 is formed larger than the light-receiving area of each of the plurality of outer-circumferential cells 28 to 32, taking into consideration a light-shielding area where the pointers 7 overlap with the center cell 27.

Figure 5:
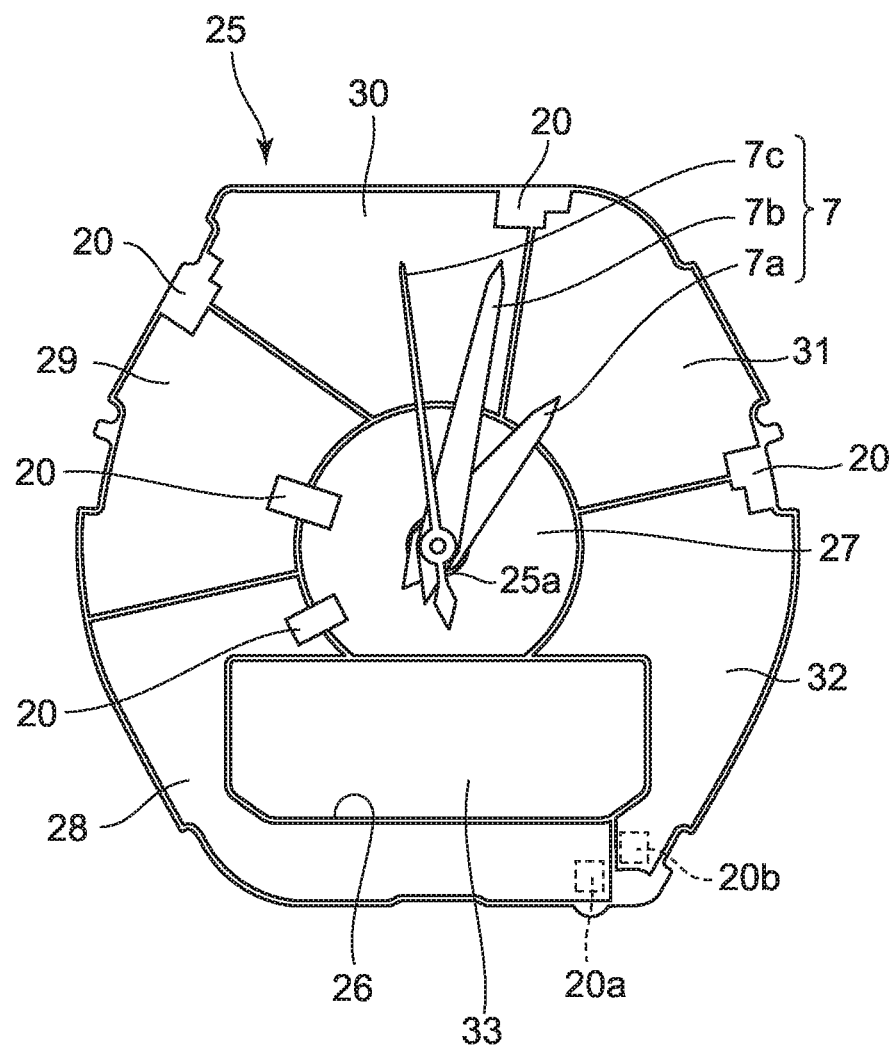
FIG. 5 is an enlarged front view of a solar panel in a second embodiment of the present invention applied to a pointer-type wristwatch.

That is, the light-receiving area of the center cell 27 is formed larger than the light-receiving area of each of the plurality of outer-circumferential cells 28 to 32 by an approximately average light-shielding area between maximum and minimum light-shielding areas where the pointers 7 overlap with the center cell 27, as depicted in FIG. 5.

On the other hand, the display window section 26, which is a non-light-receiving area, is structured such that a display panel 33 is correspondingly arranged on its lower side, and information displayed thereon can be viewed from the outside through the dial plate 4, as depicted in FIG. 5. In this embodiment, the display panel 33 is a flat-type display panel such as a liquid-crystal display panel or an EL (electroluminescence) display panel, and is structured to electro-optically display information such as the time.

The display window section 26 is a rectangular-shaped hole section, and is provided in an area on the six o'clock side of the solar panel 25, as depicted in FIG. 5. In this embodiment, the display window section 26 is provided on the solar panel 25 such that it is surrounded by the center cell 27 and two outer-circumferential cells 28 and 32 on the six o'clock side.

That is, the display window section 26 is provided such that part of its upper side portion is adjacent to the lower side of the center cell 27 and its main portion is adjacent to the two outer-circumferential cells 28 and 32 on the six o'clock side by being interposed therebetween, as depicted in FIG. 5. Accordingly, the light-receiving area of the entire solar panel 25 is area obtained by subtracting the area of the display window section 26 from the area of the entire solar panel 25.

As a result, the center cell 27 has a shape where a lower side portion has been cut off. Also, the two outer-circumferential cells 28 and 32 on the six o'clock side have a shape whose one portion has been cut off by the left and right halves of the display window section 26 being interposed therebetween. As such, the center cell 27 and the plurality of outer-circumferential cells 28 to 32 are formed such that they have a substantially same light-receiving amount, although these cells have different shapes, as depicted in FIG. 5.

That is, the center cell 27 is formed such that its light-receiving area is larger than the light-receiving area of each of the plurality of outer-circumferential cells 28 to 32 by the approximately average light-shielding area between the maximum and minimum light-shielding areas where the pointers 7 overlap with the center cell 27, as depicted in FIG. 5. Also, the plurality of outer-circumferential cells 28 to 32 are formed such that they have light-receiving areas of the same size although they have different shapes.

In this solar panel 25 as well, the cells are sequentially connected in series by the plurality of connecting sections 20, as with the first embodiment. Specifically, these connecting sections 20 are each made of conductive paste, and electrically connect the lower electrode 16 of each cell 27 to 32 and the upper electrode 18 of each cell 27 to 32 adjacent thereto.

In this embodiment as well, among the center cell 27 and the plurality of outer-circumferential cells 28 to 32, two outer-circumferential cells 28 and 32 positioned at the last end are not connected to each other by the connecting section 20, as depicted in FIG. 5. The upper electrode 18 of one outer-circumferential cell 28 is connected to the output terminal 20*a* positioned at its outer-circumferential portion, and the lower electrode 16 of the other outer-circumferential cell 32 is connected to the output terminal 20*b* positioned at its outer-circumferential portion, as with the first embodiment.

This pair of output terminals 20*a* and 20*b* is structured to be connected to a pair of input electrodes (not depicted in the drawings) of the timepiece module 1, as with the first embodiment. As a result, the solar panel 25 is structured to supply generated electric power to a chargeable battery (not depicted in the drawings) of the timepiece module 1.

Next, the operation of the solar panel 25 in the above-structured pointer type wristwatch is described. In a normal state, the pointers 7 such as the hour hand 7*a*, the minute hand 7*b*, and the second hand 7*c* are moved above the dial plate 4 by the timepiece movement 5 so as to indicate the time. In addition, the display panel 33 is driven to display information such as the time, which can be viewed from above the dial plate 4 through the display window section 26.

Here, external light such as sunlight is applied to the dial plate 4, and the applied external light passes through the dial plate 4 to be applied to the cells 27 to 32 of the solar panel 25. Then, this external light is applied to the power generation layer 17 of each of the cells 27 to 32, and each power generation layer 17 generates electric power by using this applied light, as with the first embodiment. The generated electric power is sent from each of the output terminals 20*a* and 20*b* of the outer-circumferential cells 28 and 32 to the chargeable battery (not depicted in the drawings) of the timepiece module 1 for charging.

When the solar panel 25 is generating electric power as described above, in the area above the center cell 27 among the center cell 27 and the plurality of outer-circumferential cells 28 to 32, the three pointers 7, that is, the hour hand 7*a*, the minute hand 7*b*, and the second hand 7*c* move while constantly overlapping with the center cell 27, as depicted in FIG. 5. However, since the light-receiving area of the center cell 27 has been formed taking into consideration this overlap of the pointers 7 and therefore is larger than the light-receiving area of each of the plurality of outer-circumferential cells 28 to 32, the light-receiving area of the center cell 27 is substantially equal to the light-receiving area of each of the plurality of outer-circumferential cell 28 to 32, even though the display window section 26 has been provided.

As a result, the fluctuations of the light-receiving areas of the center cell 27 and the outer-circumferential cells 28 to 32 due to the overlap of the pointers 7 can be minimized, as with the first embodiment. Accordingly, the light-receiving amounts of the center cell 27 and the plurality of outer-circumferential cells 28 to 32 can be substantially equalized, even though the display window section 26 has been provided. Consequently, an output current from the entire solar panel 25 is acquired while being stabilized at a high value, irrespective of the display window section 26 and the positions of the pointers 7. That is, the value of current to be outputted from the entire solar panel 25 can be maximized.

As such, in the solar panel 25 of this wristwatch, the display window section 26 is provided which is a non-light receiving area surrounded by the center cell 27 and the two outer-circumferential cells 28 and 32 positioned on the six o'clock side among the center cell 27 and the plurality of outer-circumferential cells 28 to 32. As a result, the display panel 33 can be provided below the display window section 26, whereby information displayed on the display panel 33 can be favorably viewed through the display window section 26.

In this embodiment as well, the solar panel 25 is formed such that the light-receiving area of the center cell 27 is larger than the light-receiving area of each of the plurality of outer-circumferential cells 28 to 32, taking into consideration the light-shielding area where the pointers 7 mounted on the pointer shaft 6 overlap with the center cell 27, as with the first embodiment. As a result, even though the display window section 26 which is a non-light-receiving region is provided, the fluctuation of the light-receiving area of each cell 27 to 32 due to the pointers 7 can be minimized. Therefore, the light-receiving amounts of the cells 27 to 32 can be substantially equalized, and output currents can be maximally improved.

That is, in this solar panel 25 as well, even though the pointers 7 always overlap with the center cell 27 and part of the pointers 7 overlaps with one of the plurality of outer-circumferential cells 28 to 32 when the pointers 7 are moving above the center cell 27 and the plurality of outer-circumferential cells 28 to 32, the fluctuation of each light-receiving area of the center cell 27 and the plurality of outer-circumferential cells 28 to 32 due to the overlap of the pointers 7 can be minimized.

Therefore, the light-receiving amounts of the center cell 27 and the outer-circumferential cells 28 to 32 can be substantially equalized, even though the display window section 26 which is a non-light-receiving area is provided. Accordingly, the output current of the cells 27 to 32 as a whole can be stabilized at a high value, irrespective of the positions of the pointers 7. As a result, the output current of the cells 27 to 32 as a whole can be maximally improved.

In this embodiment as well, the center cell 27 is formed such that its light-receiving area is larger than the light-receiving area of each of the plurality of outer-circumferential cells 28 to 32 by the approximately average light-shielding area between the maximum and minimum light-shielding areas where the pointers 7 overlap with the center cell 27. Therefore, even in the case where the pointers 7 always overlap with the center cell 27 and the center cell 27 is light-shielded, the light-receiving amount of the center cell 27 and the light-receiving amount of each of the plurality of outer-circumferential cells 28 to 32 can have a substantially same value.

Accordingly, even when part of the pointers 7 overlaps with one of the plurality of outer-circumferential cells 28 to 32, the fluctuations of the light-receiving areas of the center cell 27 and the plurality of outer-circumferential cells 28 to 32 due to this overlap can be minimized. Therefore, the light-receiving amounts of the center cell 27 and the plurality of outer-circumferential cells 28 to 32 can be substantially equalized, irrespective of the display window section 26 that is a non-light-receiving region, and the positions of the pointers 7.

Third Embodiment

Next, a third embodiment of the present invention applied to a pointer-type wristwatch is described with reference to FIG. 6 and FIG. 7.

In this case as well, sections identical to those of the first embodiment depicted in FIG. 1 to FIG. 4 are provided with the same reference numerals for description.

Figure 6:
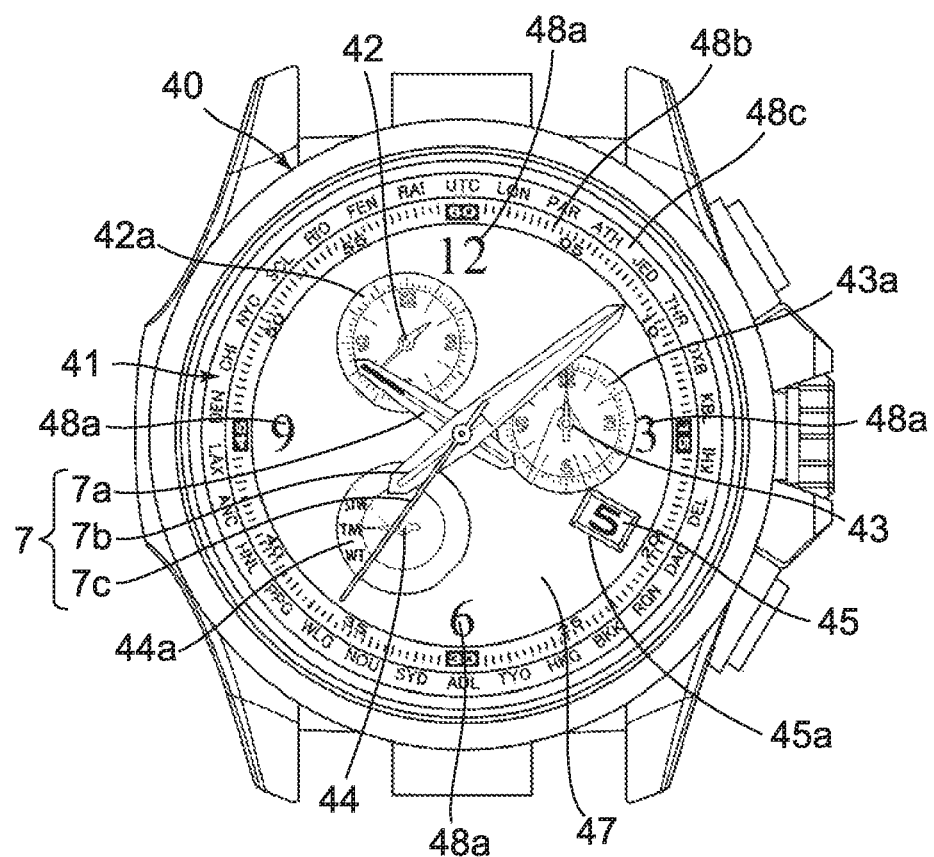
FIG. 6 is an enlarged front view of a pointer-type wristwatch in a third embodiment of the present invention.

This pointer-type wristwatch includes a wristwatch case 40, as depicted in FIG. 6. Inside the wristwatch case 40, a timepiece module 41 is provided.

The timepiece module 41 includes the timepiece movement 5 (refer to FIG. 1) for driving and moving the pointers 7, a first functional pointer 42, a second functional pointer 43, a third functional pointer 44, and a day wheel 45, and an antenna for GPS reception (not depicted in the drawings), as depicted in FIG. 6. The timepiece module 41 is structured such that a solar panel 46 and a dial plate 47 are arranged thereabove, as depicted in FIG. 6 and FIG. 7.

In this case, the first functional pointer 42, the second functional pointer 43, the third functional pointer 44 are structured to move above the dial plate 47 as depicted in FIG. 6, and the day wheel 45 is formed in a ring shape and has dates printed on the upper surface thereof. This day wheel 45 arranged below the solar panel 46 is rotated only by a predetermined angle in twenty-four hours, and the dates are sequentially displayed at a date window section 45a of the dial plate 47 by being switched every twenty-four hours.

As with the first embodiment, the dial plate 47 is constituted by a transparent or semitransparent film, and has hour characters 48a, markings 48b, and city names 48c for indicating times in the world provided in a ring shape along the circumference of the dial plate 47, as depicted in FIG. 6. On the ten o'clock side of the dial plate 47, a first marking section 42a for the first functional pointer 42 is provided in a circular shape. Also, on the three clock side of the dial plate 47, a second marking section 43a for the second functional pointer 43 is provided in a circular shape.

As depicted in FIG. 6, on the seven o'clock side of the dial plate 47, a function display section 44a for the third functional pointer 44 is provided in a circular shape. On the four o'clock side of the dial plate 47, the date window section 45a where the date of the day wheel 45 is positioned is provided. In this embodiment, only necessary portions of the first marking section 42a for the first functional pointer 42, the second marking section 43a for the second functional pointer 43, and the function display section 44a for the third functional pointer 44 are printed. These printed portions slightly shield external light, but other portions allows light to pass through.

Figure 7:
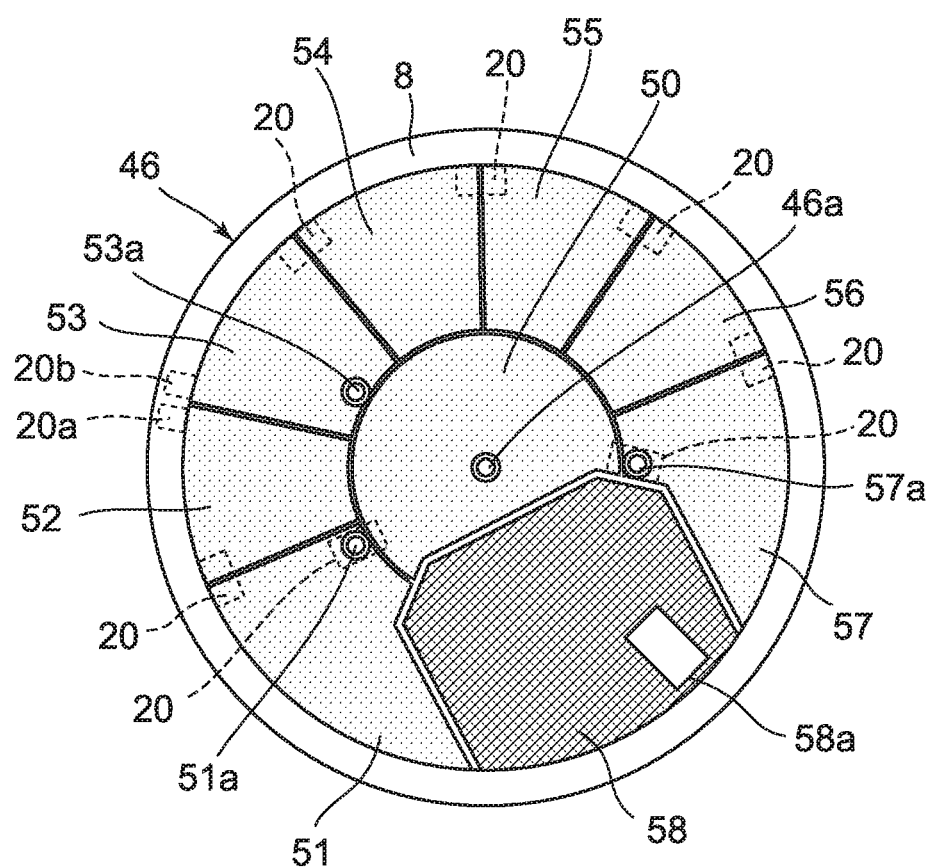
FIG. 7 is an enlarged front view of a solar panel of the wristwatch depicted in FIG. 6.

The solar panel 46 is formed in a circular shape substantially equal in size to the dial plate 47, as depicted in FIG. 7. This solar panel 46 has a center cell 50 formed in a circular shape along the periphery of a through hole 46a provided at the center, a plurality of outer-circumferential cells 51 to 57 formed around the periphery of the center cell 50 and having light-receiving areas of a substantially same size, and a non-light-receiving area section 58 provided corresponding to an antenna for GPS reception (not depicted in the drawings).

In this embodiment as well, the shapes and sizes of the center cell 50 and the plurality of outer-circumferential cells 51 to 57 are formed such that their light-receiving amounts are substantially equal to each other, as with the first embodiment. That is, the light-receiving area of the center cell 50 is formed larger than the light-receiving area of each of the plurality of outer-circumferential cells 51 to 57, taking into consideration a light-shielding area where the pointers 7 overlap with the center cell 50.

That is, the light-receiving area of the center cell 50 is formed larger than the light-receiving area of each of the plurality of outer-circumferential cells 51 to 57 by an approximately average light-shielding area between maximum and minimum light-shielding areas where the pointers 7 overlap with the center cell 50, as depicted in FIG. 7.

Below the non-light-receiving area section 58, the antenna for GPS reception (not depicted in the drawings) is correspondingly arranged, as depicted in FIG. 7. In order to allow electric waves to easily reach this antenna, electrodes and semiconductors have been removed from this non-light-receiving area section 58. That is, this non-light-receiving area section 58 is formed only of the film substrate 8 (refer to FIG. 4) made of synthetic resin. In this embodiment the non-light-receiving area section 58 is colored using the same color as that of each cell 50 to 57.

The non-light-receiving area section 58 is formed in a substantially rectangular shape in an area between the four o'clock portion and the six o'clock portion of the solar panel 46, as depicted in FIG. 7. The non-light-receiving area section 58 is provided with a date hole 58a corresponding to the date window section 45a of the dial plate 47. As a result, the date indicated by the day wheel 45 is structured to be viewable from the date window section 45a of the dial plate 47 through the date hole 58a of the solar panel 46.

That is, the non-light-receiving area section 58 is provided such that part of its upper side portion is adjacent to the lower side of the center cell 50 and its main portion is adjacent to side portions of two outer-circumferential cells 51 and 57 positioned on the four o'clock side and the six o'clock side, respectively, as depicted in FIG. 7. Accordingly, the light-receiving area of the entire solar panel 46 is area obtained by subtracting the area of the non-light-receiving area section 58 from the area of the entire solar panel 46.

As a result, the center cell 50 has a shape where a lower side portion has been cut off. Also, the two outer-circumferential cells 51 and 57 positioned on the four o'clock side and the six o'clock side have a shape whose one portion has been cut off along both end portions of the non-light-receiving area section 58. As such, the center cell 50 and the plurality of outer-circumferential cells 51 to 57 are formed such that they have a substantially same light-receiving amount although they have different shapes, as depicted in FIG. 7.

That is, the center cell 50 is formed such that its light-receiving area is larger than the light-receiving area of each of the plurality of outer-circumferential cells 51 to 57 by the approximately average light-shielding area between the maximum and minimum light-shielding areas where the pointers 7 overlap with the center cell 50, as depicted in FIG. 7. Also, the plurality of outer-circumferential cells 51 to 57 are formed such that they have light-receiving areas of a substantially same size although they have different shapes.

In this embodiment, among the plurality of outer-circumferential cells 51 to 57, the outer-circumferential cell 53 positioned on the ten o'clock side is provided with a through hole 53a corresponding to the rotation center of the first functional pointer 42, as depicted in FIG. 7. Also, the outer-circumferential cell 57 positioned on the three o'clock side is provided with a through hole 57a corresponding to the rotation center of the second functional pointer 43. Moreover, the outer-circumferential cell 51 positioned on the seven o'clock side is provided with a through hole 51a corresponding to the rotation center of the third functional pointer 44.

As a result, although having different shapes, the center cell 50 and the plurality of outer-circumferential cells 51 to 57 are formed such that their light-receiving areas are substantially equal in size, taking into consideration portions shaded by the first to third functional pointers 42 to 44 and portions shaded by the first and second marking sections 42*a* and 43*a* and the function display section 44*a*, as depicted in FIG. 7.

In this solar panel 46 as well, the cells are sequentially connected in series by the plurality of connecting sections 20, as with the first embodiment. Specifically, these connecting sections 20 are each made of conductive paste, and electrically connect the lower electrode 16 of each cell 50 to 57 and the upper electrode 18 of each cell 50 to 57 adjacent thereto.

In this embodiment as well, among the center cell 50 and the plurality of outer-circumferential cells 51 to 57, two outer-circumferential cells 52 and 53 positioned at the last end are not connected to each other by the connecting section 20. The upper electrode 18 of one outer-circumferential cell 52 is connected to the output terminal 20*a* positioned at its outer-circumferential portion, and the lower electrode 16 of the other outer-circumferential cell 53 is connected to the output terminal 20*b* positioned at its outer-circumferential portion, as with the first embodiment.

This pair of output terminals 20*a* and 20*b* is structured to be connected to a pair of input electrodes (not depicted in the drawings) of the timepiece module 41, as with the first embodiment. As a result, the solar panel 46 is structured to supply generated electric power to a chargeable battery (not depicted in the drawings) of the timepiece module 41.

Next, the operation of the solar panel 46 in the above-structured pointer-type wristwatch is described. In a normal state, the pointers 7 such as the hour hand 7*a*, the minute hand 7*b*, and the second hand 7*c* are moved above the dial plate 47 by the timepiece movement 5 so as to indicate the time. In addition, the first functional pointer 42 moves above the first marking section 42*a*, the second functional pointer 43 moves above the second marking section 43*a*, and the third functional pointer 44 moves above the function display section 44*a*.

Here, external light such as sunlight is applied to the dial plate 47, and the applied external light passes through the dial plate 47 to be applied to the cells 50 to 57 of the solar panel 46. Then, this external light is applied to the power generation layer 17 of each of the cells 50 to 57, and each power generation layer 17 generates electric power by using this applied light, as with the first embodiment. The generated electric power is sent from each of the output terminals 20*a* and 20*b* of the outer-circumferential cells 52 and 53 to the chargeable battery (not depicted in the drawings) of the timepiece module 41 for charging.

When the solar panel 46 is generating electric power as described above, in the area above the center cell 50 among the center cell 50 and the plurality of outer-circumferential cells 51 to 57, the three pointers 7, that is, the hour hand 7*a*, the minute hand 7*b*, and the second hand 7*c* move while being constantly positioned above the center cell 50. In the area above the outer-circumferential cells 51 to 57, the first to third functional pointers 42 to 44 move while being positioned above the marking sections 42*a* and 43*a* and the function display section 44*a*, as depicted in FIG. 7.

Here, the shapes and sizes of the center cell 50 and the plurality of outer-circumferential cells 51 to 57 have been formed such that the light-receiving areas of the center cell 50 and the plurality of outer-circumferential cells 51 to 57 are substantially equal to each other, taking into consideration the overlap of the pointers 7 and the first to third functional pointers 42 to 44 with the solar panel 46. Therefore, the light-receiving areas of the center cell 50 and the plurality of outer-circumferential cells 51 to 57 are substantially equal to each other, even though the non-light-receiving area section 58 has been provided.

As a result, the fluctuations of the light-receiving areas of the center cell 50 and the plurality of outer-circumferential cells 51 to 57 due to the overlap of the pointers 7 can be minimized, as with the first embodiment. Accordingly, the light-receiving amounts of all of the center cell 50 and the plurality of outer-circumferential cells 51 to 57 can be substantially equalized, even though the non-light-receiving area section 58 has been provided. Consequently, an output current from the entire solar panel 46 is acquired while being stabilized at a high value, irrespective of the non-light-receiving area section 58 and the positions of the pointers 7. That is, the value of current to be outputted from the entire solar panel 46 can be maximized.

As such, the solar panel 46 of the wristwatch in the third embodiment is provided with the non-light-receiving area section 58 surrounded by the center cell 50 and the two outer-circumferential cells 51 and 57 positioned on the four o'clock side and the six o'clock side among the center cell 50 and the plurality of outer-circumferential cells 51 to 57. Accordingly, an antenna for GPS (not depicted in the drawings) can be provided below the non-light-receiving area section 58. As a result, electric waves can be favorably received by the antenna through the non-light-receiving area section 58.

In this embodiment as well, the solar panel 46 is formed such that the light-receiving area of the center cell 50 is larger than the light-receiving area of each of the plurality of outer-circumferential cells 51 to 57, taking into consideration the light-shielding area where the pointers 7 mounted on the pointer shaft 6 overlap with the center cell 50, as with the first embodiment. As a result, even though the non-light-receiving area section 58 is provided, the fluctuation of the light-receiving area of each cell 50 to 57 due to the pointers 7 can be minimized. Therefore, the light-receiving amounts of the cells 50 to 57 can be substantially equalized, and output currents can be maximally improved.

That in this the solar panel 46 as well, even though the pointers 7 always overlap with the center cell 50 and part of the pointers 7 overlaps with one of the plurality of outer-circumferential cells 51 to 57 when the pointers 7 are moving above the center cell 50 and the plurality of outer-circumferential cells 51 to 57, the fluctuation of each light-receiving area of the center cell 50 and the plurality of outer-circumferential cells 51 to 57 due to the overlap of the pointers 7 can be minimized.

Therefore, the light-receiving amounts of the center cell 50 and the plurality of outer-circumferential cells 51 to 57 can be substantially equalized, even though the non-light-receiving area section 53 is provided. Accordingly, the output current of the cells 50 to 57 as a whole can be stabilized at a high value, irrespective of the positions of the pointers 7. As a result, the output current of the cells 50 as a whole can be maximally improved.

In this embodiment as well, the center cell 50 is formed such that its light-receiving area is larger than the light-receiving area of each of the plurality of outer-circumferential cells 51 to 57 by the approximately average light-shielding area between the maximum and minimum light-shielding areas where the pointers 7 overlap with the center cell 50. Therefore, even in the case where the pointers 7 always overlap with the center cell 50 and the center cell 50 is light-shielded, the light-receiving amount of the center cell 50 and the light-receiving amount of each of the plurality of outer-circumferential cells 51 to 57 can have a substantially same value.

Accordingly, even when part of the pointers 7 overlaps with one of the plurality of outer-circumferential cells 51 to 57, the fluctuations of the light-receiving areas of the center cell 50 and the plurality of outer-circumferential cells 51 to 57 due to this overlap can be minimized. Therefore, the light-receiving amounts of the center cell 50 and the plurality of outer-circumferential cells 51 to 57 can be substantially equalized, irrespective of the non-light-receiving area section 58 and the positions of the pointers 7.

Also, regarding this solar panel 46, the shapes and sizes of the cells 50 to 57 are formed such that the light-receiving areas of the center cell 50 and the plurality of outer-circumferential cells 51 to 57 are substantially equal, taking into consideration the area shaded by the first and second marking sections 42a and 43a and the function display section 44a being provided on the dial plate 47 and the first to third functional pointers 42 to 44 moving above the solar panel 46. As a result, influences from these first to third functional pointers 42 to 44, the first and second marking sections 42a and 43a, and the function display section 44a can be minimized, and the light-receiving amounts of the center cell 50 and the plurality of outer-circumferential cells 51 to 57 can be substantially equalized.

Figure 8:
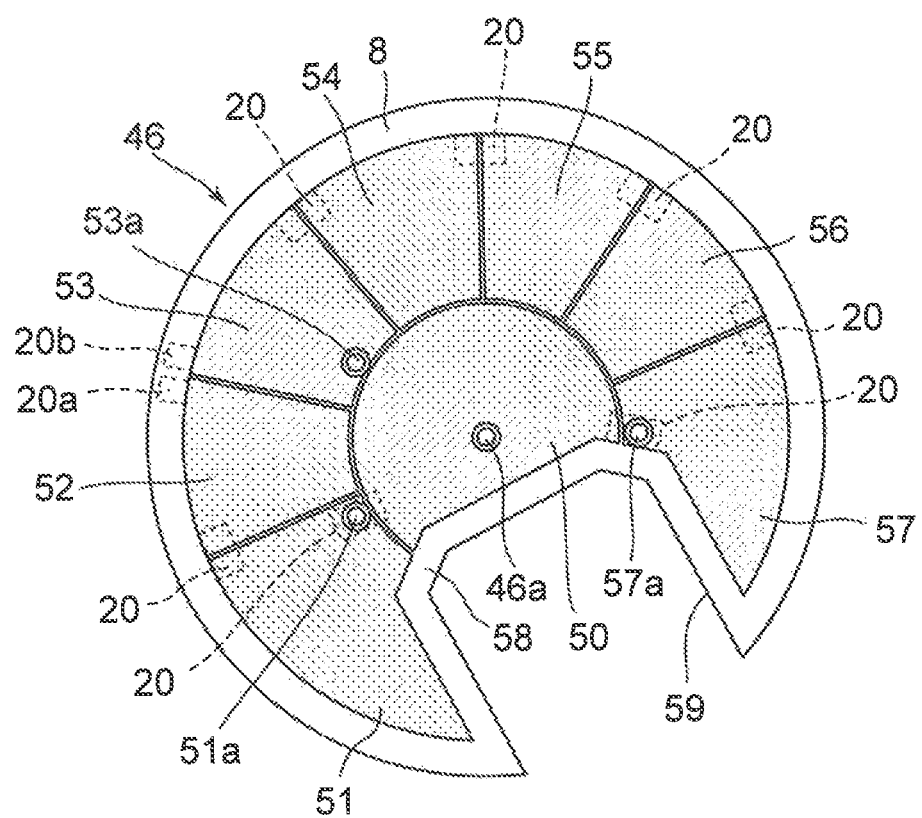
FIG. 8 is an enlarged front view of a modification example of the solar panel in the third embodiment depicted in FIG. 7.

In the above-described third embodiment, the non-light-receiving area section 58 of the solar panel 46 is formed only of the film substrate 8, and colored using the same color as that of each cell 50 to 57. However, the present invention is not limited thereto. For example, the non-light-receiving area section 58 may be formed of a notched portion 59 by being cut off along its inner circumference, as in a modification example depicted in FIG. 8.

Fourth Embodiment

Next, a fourth embodiment of the present invention applied to a pointer-type wristwatch is described with reference to FIG. 9. In this case, sections identical to those of the third embodiment depicted in FIG. 6 and FIG. 7 are provided with the same reference numerals for description. This pointer-type wristwatch is similar in structure to that of the third embodiment except that a center cell 60 and outer-circumferential cells 51 to 67 in the solar panel 46 have structures different from those of the third embodiment, as depicted in FIG. 9.

Figure 9:
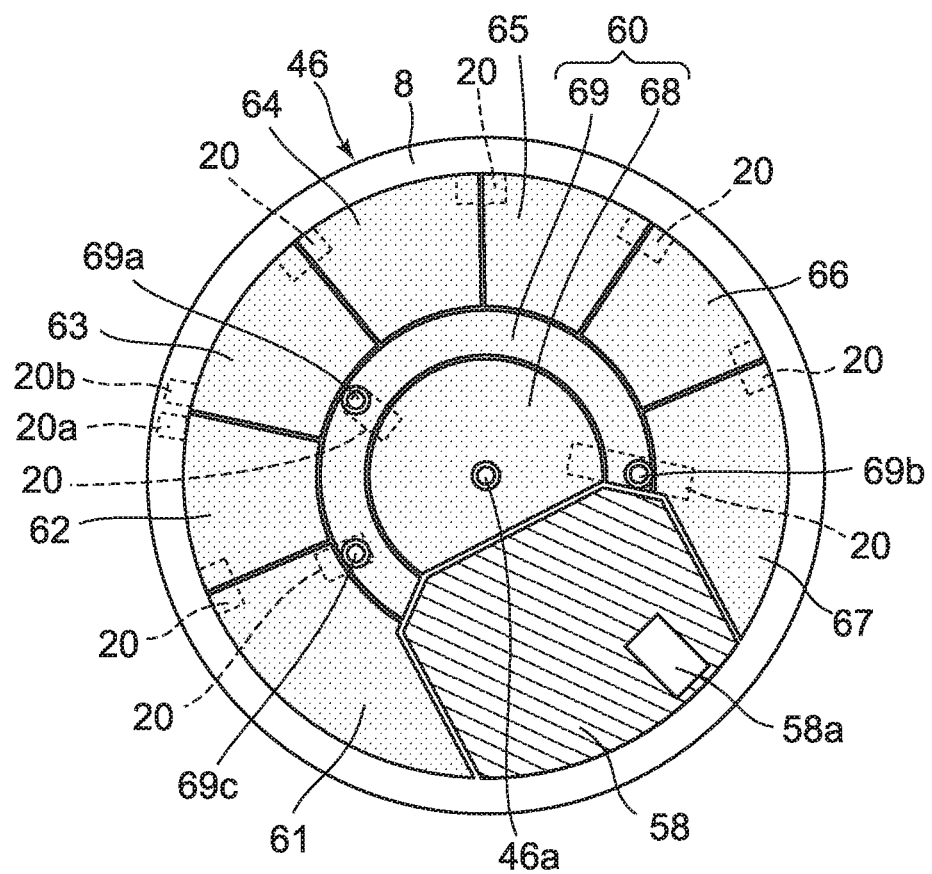
FIG. 9 is an enlarged front view of a solar panel in a fourth embodiment of the present invention applied to a pointer-type wristwatch.

That is, the center cell 60 is divided into a first center cell 68 and a second center cell 69, as depicted in FIG. 9. The first center cell 68 is formed along the periphery of the through hole 46a provided at the center of the solar panel 46. The second center cell 69 is formed along the outer periphery of the first center cell 68. The shapes and sizes of the first center cell 68, the second center cell 69, and the outer-circumferential cells 61 to 67 are formed such that their light-receiving amounts are substantially equal to each other, as in the other embodiments.

In this case, the light-receiving area of each of the first and second center cells 68 and 69 is formed larger than the light-receiving area of each of the plurality of outer-circumferential cells 61 to 67, taking into consideration a light-shielding area where the pointers 7 overlap with each of the first and second center cells 68 and 69. That is, the light-receiving area of each of the first and second center cells 68 and 69 is formed larger than the light-receiving area of each of the plurality of outer-circumferential cells 61 to 67 by an approximately average light-shielding area between maximum and minimum light-shielding areas where the pointers 7 overlap with each of the first and second center cells 68 and 69, as depicted in FIG. 9.

Below the non-light-receiving area section 58, the antenna for GPS reception (not depicted in the drawings) is correspondingly arranged, as depicted in FIG. 9. In order to allow electric waves to easily reach this antenna, electrodes and semiconductors have been removed from this non-light-receiving area section 58. That is, this non-light-receiving area section 58 is formed only of the film substrate 8 made of synthetic resin. In this embodiment as well, the non-light-receiving area section 58 is colored using the same color as that of each cell 60 to 67.

The non-light-receiving area section 58 is formed in a substantially rectangular shape in an area between the four o'clock portion and the six o'clock portion of the solar panel 46, as with the third embodiment. The non-light-receiving area section 58 is provided with the date hole 58a corresponding to the date window section 45a of the dial plate 47, as depicted in FIG. 9.

That is, the non-light-receiving area section 58 is provided such that part of its upper side portion is adjacent to the lower side of the first center cell 68 by a portion of the second center cell 69 being cut off, and its main portion is adjacent to side portions of two outer-circumferential cells 61 and 67 positioned on the four o'clock side and the six o'clock side, respectively. Accordingly, the light-receiving area of the entire solar panel 46 is area obtained by subtracting the area of the non-light-receiving area section 58 from the area of the entire solar panel 46, as with the third embodiment.

As a result, the first center cell 68 has a shape where a lower side portion has been cut off, as depicted in FIG. 9. In addition, the second center cell 69 has a shape where a portion between the three o'clock portion and the seven o'clock portion has been cut off. Moreover, the two outer-circumferential cells 61 and 67 positioned on the four o'clock side and the six o'clock side have shapes cut along the sides of the non-light-receiving area section 58. As such, the first center cell 68, the second center cell 69, and the plurality of outer-circumferential cells 61 to 67 are formed such that they have a substantially same light-receiving amount although they have different shapes.

That is, the first center cell 68 and the second center cell 69 are formed such that the light-receiving area of each of the first and second center cells 68 and 69 is larger than the light-receiving area of each of the plurality of outer-circumferential cells 61 to 67 by the approximately average light-shielding area between the maximum and minimum light-shielding areas where the pointers 7 overlap with each of the first and second center cells 68 and 69, as depicted in FIG. 9. Also, the plurality of outer-circumferential cells 61 to 67 are formed such that they have light-receiving areas of a substantially same size although they have different shapes.

In this embodiment, a through hole 69a is provided in an area on the ten o'clock side of the second center cell 69, corresponding to the rotation center of the first functional pointer 42, and a through hole 69b is provided in an area on the three o'clock side of the second center cell 69, corresponding to the rotation center of the second functional pointer 43, as depicted in FIG. 9. In addition, a through hole 69c is provided in an area on the seven o'clock side of the second center cell 69, corresponding to the rotation center of the third functional pointer 44.

As a result, although having different shapes, the first and second center cells 68 and 69 of the center cell 60 and the plurality of outer-circumferential cells 61 to 67 are formed such that their light-receiving areas are substantially equal in size, taking into consideration portions shaded by the first to third functional pointers 42 to 44 and portions shaded by the first and second marking sections 42a and 43a and the function display section 44a, as depicted in FIG. 9.

In this solar panel 46 as well, the cells are sequentially connected in series by the plurality of connecting sections 20, as with the first embodiment. Specifically, these connecting sections 20 are each made of conductive paste, and electrically connect the lower electrode 16 of each cell 61 to 69 and the upper electrode 18 of each cell 61 to 69 adjacent thereto.

In this embodiment as well, among the first and second center cells 68 and 69 and the plurality of outer-circumferential cells 61 to 67, two outer-circumferential cells 62 and 63 positioned at the last end are not connected to each other by the connecting section 20, as depicted in FIG. 9.

The upper electrode 18 of one outer-circumferential cell 62 is connected to the output terminal 20a positioned at its outer-circumferential portion, and the lower electrode 16 of the other outer-circumferential cell 63 is connected to the output terminal 20b positioned at its outer-circumferential portion, as with the first embodiment.

This pair of output terminals 20a and 20b is structured to be connected to a pair of input electrodes (not depicted in the drawings) of the timepiece module 41, as with the first embodiment.

As a result, the solar panel 46 is structured to supply generated electric power to a chargeable battery (not depicted in the drawings) of the timepiece module 41.

Next, the operation of the solar panel 45 in the above-structured pointer-type wristwatch is described. In a normal state, the pointers 7 such as the hour hand 7a, the minute hand 7b, and the second hand 7c are moved above the dial plate 47 by the timepiece movement 5 so as to indicate the time.

In addition, the first functional pointer 42 moves above the first marking section 42a, the second functional pointer 43 moves above the second marking section 43a, and the third functional pointer 44 moves above the function display section 44a.

Here, external light such as sunlight is applied to the dial plate 47, and the applied external light passes through the dial plate 47 to be applied to the cells 61 to 69 of the solar panel 46.

Then, this external light is applied to the power generation layer 17 of each of the cells 61 to 69, and each power generation layer 17 generates electric power by using this applied light, as with the first embodiment. The generated electric power is sent from each of the output terminals 20a and 20b of the outer-circumferential cells 62 and 63 to the chargeable battery (not depicted in the drawings) of the timepiece module 41 for charging.

When the solar panel 46 is generating electric power as described above, in the area above the first and second center cells 68 and 69 among the first and second center cells 68 and 69 of the center cell 60 and the plurality of outer-circumferential cells 61 to 67, the three pointers 7, that is, the hour hand 7a, the minute hand 7b, and the second hand 7c move while being constantly positioned above the first and second center cells 68 and 69. In the area above the outer-circumferential cells 61 to 67, the first to third functional pointers 42 to 44 move while being positioned above the marking sections 42a and 43a and the function display section 44a, as depicted in FIG. 9.

Here, the shapes and sizes of the first and second center cells 68 and 69 of the center cell 60 and the plurality of outer-circumferential cells 61 to 67 have been formed such that the light-receiving areas of the first and second center cells 68 and 69 and the plurality of outer-circumferential cells 61 to 67 are substantially equal to each other, taking into consideration the overlap of the pointers 7 and the first to third functional pointers 42 to 44 with the solar panel 46.

Therefore, the light-receiving areas of the first and second center cells 68 and 69 and the plurality of outer-circumferential cells 61 to 67 are substantially equal to each other, even though the non-light-receiving area section 58 has been provided.

As a result, the fluctuations of the light-receiving areas of the first and second center cells 68 and 69 and the plurality of outer-circumferential cells 61 to 67 due to the overlap of the pointers 7 can be minimized, as with the first embodiment.

Accordingly, the light-receiving amounts of all of the first and second center cells 68 and 69 and the plurality of outer-circumferential cells 61 to 67 can be substantially equalized, even though the non-light-receiving area section 58 has been provided.

Consequently, an output current from the entire solar panel 46 is acquired while being stabilized at a high value, irrespective of the non-light-receiving area section 58 and the positions of the pointers 7. That is, the value of current to be outputted from the entire solar panel 46 can be maximized.

As such, in the solar panel 46 of the wristwatch in the fourth embodiment, the center cell 60 has been divided into the first center cell 68 formed along the periphery of the through hole 46a and the second center cell 69 formed along the outer periphery of the first center cell 68, and the non-light-receiving area section 58 has been provided that is being surrounded by the center cell 60 and the two outer-circumferential cells 61 and 67 positioned on the three o'clock side and the six o'clock side, among the first center cell 68, second center cell 69, and the plurality of outer-circumferential cells 61 to 67. Accordingly, an antenna for GPS (not depicted in the drawings) can be provided below the non-light-receiving area section 58, as with the third embodiment.

As a result, electric waves can be favorably received by the antenna through the non-light-receiving area section 58.

In this embodiment as well, the solar panel 46 is formed such that the light-receiving area of each of the first center cell 68 and the second center cell 69 is larger than the light-receiving area of each of the plurality of outer-circumferential cells 61 to 67, taking into consideration the light-shielding area where the pointers 7 mounted on the pointer shaft 6 overlap with the first center cell 68 and the second center cell 69.

As a result, even though the non-light-receiving area section 58 is provided, the fluctuation of the light-receiving area of each cell 61 to 69 due to the pointers 7 can be minimized. Therefore, the light-receiving amounts of the cells 61 to 69 can be substantially equalized, and output currents can be maximally improved.

That is, in this solar panel 46 as well, even though the pointers 7 always overlap with the first and second center cells 68 and 69 and part of the pointers 7 overlaps with one of the plurality of outer-circumferential cells 61 to 67 when the pointers 7 are moving above the first and second center cells 68 and 69 and the plurality of outer-circumferential cells 61 to 67, the fluctuation of each light-receiving area of the first and second center cells 68 and 69 and the plurality of outer-circumferential cells 61 to 67 due to the overlap of the pointers 7 can be minimized.

Therefore, the light-receiving amounts of the first and second center cells 68 and 69 and the plurality of outer-circumferential cells 61 to 67 can be substantially equalized, even though the non-light-receiving area section 58 is provided.

Accordingly, the output current of the cells 61 to 69 as a whole can be stabilized at a high value, irrespective of the positions of the pointers 7. As a result, the output current of the cells 61 to 69 as a whole can be maximally improved.

In this embodiment as well, the first and second center cells 68 and 69 of the center cell 60 are formed such that the light-receiving area of each of the first and second center cells 68 and 69 is larger than the light-receiving area of each of the plurality of outer-circumferential cells 61 to 67 by the approximately average light-shielding area between the maximum and minimum light-shielding areas where the pointers 7 overlap with the first and second center cells 68 and 69.

Therefore, even in the case where the pointers 7 always overlap with the first and second center cells 68 and 69 and the first and second center cells 68 and 69 are light-shielded, the light-receiving amount of each of the first and second center cells 68 and 69 and the light-receiving amount of each of the plurality of outer-circumferential cells 61 to 67 can have a substantially same value.

Accordingly, even when part of the pointers 7 overlaps with one of the plurality of outer-circumferential cells 61 to 67, the fluctuations of the light-receiving areas of the first and second center cells 68 and 69 and the plurality of outer-circumferential cells 61 to 67 due to this overlap can be minimized.

Therefore, the light-receiving amounts of the first and second center cells 68 and 69 and the plurality of outer-circumferential cells 61 to 67 can be substantially equalized, irrespective of the non-light-receiving area section 58 and the positions of the pointers 7.

Also, regarding this the solar panel 46, the shapes and sizes of the cells 61 to 69 are formed such that the light-receiving areas of the first and second center cells 68 and 69 and the plurality of outer-circumferential cells 61 to 67 are substantially equal, taking into consideration the area shaded by the first and second marking sections 42a and 43a and the function display section 44a being provided on the dial plate 47 and the first to third functional pointers 42 to 44 moving above the solar panel 46. As a result, influences from these first to third functional pointers 42 to 44, the first and second marking sections 42a and 43a, and the function display section 44a can be minimized, and the light-receiving amounts of the first and second center cells 68 and 69 and the plurality of outer-circumferential cells 61 to 67 can be substantially equalized.

Fifth Embodiment

Next, a fifth embodiment of the present invention applied to a pointer-type wristwatch is described with reference to FIG. 10.

In this case as well, sections identical to those of the third embodiment depicted in FIG. 6 and FIG. 7 are provided with the same reference numerals for description.

Figure 10:
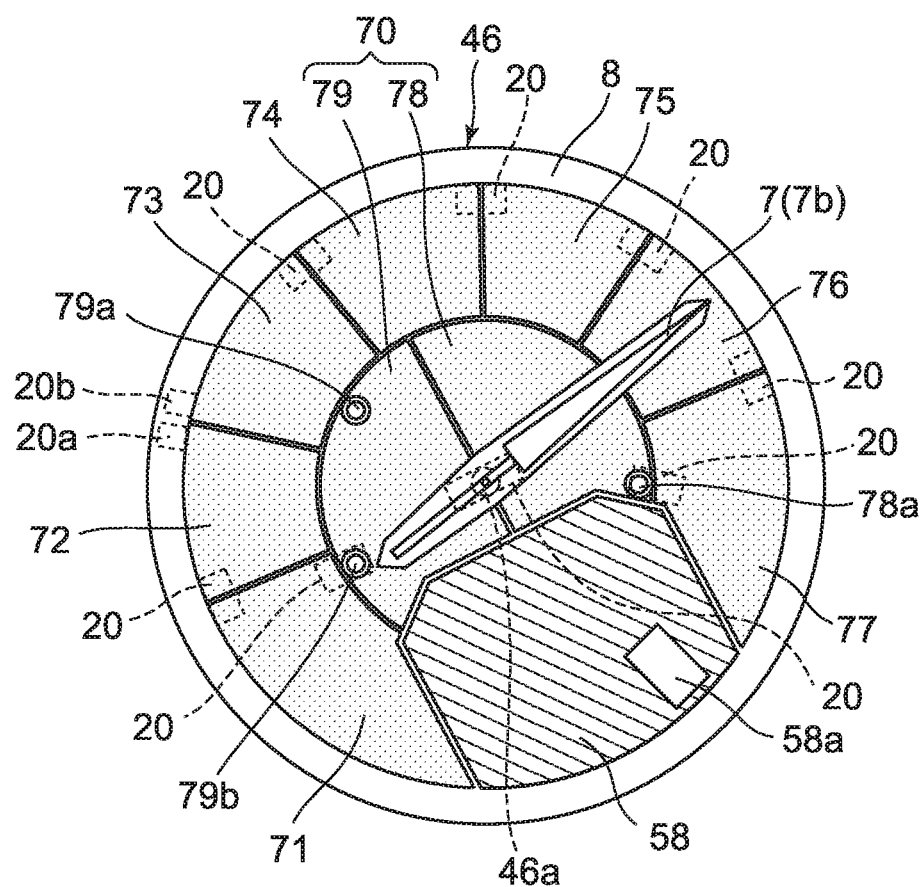
FIG. 10 is an enlarged front view of a solar panel in a fifth embodiment of the present invention applied to a pointer-type wristwatch.

This pointer-type wristwatch is also similar in structure to that of the third embodiment except that a center cell 70 and outer-circumferential cells 71 to 77 in the solar panel 46 have structures different from those of the third embodiment, as depicted in FIG. 10.

That is, the center cell 70 is divided into a first center cell 78 and a second center cell 79, as depicted in FIG. 10.

The first center cell 78 is provided in a semicircular shape on the two o'clock side with the through hole 46a at the center of the solar panel 46 as a boundary.

The second center cell 79 is provided in a semicircular shape on the eight o'clock side with the through hole 46a at the center of the solar panel 46 as a boundary.

In this embodiment as well, the shapes and sizes of the first center cell 78, the second center cell 79, and the outer-circumferential cells 71 to 77 are formed such that their light-receiving amounts are substantially equal to each other.

In this case as well, the light-receiving area of each of the first and second center cells 78 and 79 is formed larger than the light-receiving area of each of the plurality of outer-circumferential cells 71 to 77, taking into consideration a light-shielding area where the pointers 7 overlap with each of the first and second center cells 78 and 79.

That is, the light-receiving area of each of the first and second center cells 78 and 79 is formed larger than the light-receiving area of each of the plurality of outer-circumferential cells 71 to 77 by an approximately average light-shielding area between maximum and minimum light-shielding areas where the pointers 7 overlap with each of the first and second center cells 78 and 79, as depicted in FIG. 10.

In this case, for example, the minute hand 7b of the printers 7 is positioned with its tip extending to an area above one of the outer-circumferential cells 71 to 77 from an area above the outer-circumferential circle of the center cell 70 and the rear end opposite to this tip extending to an area near the outer-circumferential circle of the center cell 70, when rotating around the pointer shaft 6, as depicted in FIG. 10.

That is, the minute hand 7b is structured to move with it being positioned across both areas of the first and second center cells 78 and 79 in the center cell 70. The hour hand 7a and the second hand 7c are structured similarly to the minute hand 7b.

Below the non-light-receiving area section 58, the antenna for GPS reception (not depicted in the drawings) is correspondingly arranged, as depicted in FIG. 10. In order to allow electric waves to easily reach this antenna, electrodes and semiconductors have been removed from this non-light-receiving area section 58. That is, this non-light-receiving area section 58 is formed only of the film substrate 8 made of synthetic resin.

In this embodiment as well, the non-light-receiving area section 58 is colored using the same color as that of each cell 70 to 77, as with the third embodiment.

The non-light-receiving area section 58 is formed in a substantially rectangular shape in an area between the four o'clock portion and the six o'clock portion of the solar panel 46, as with the third embodiment.

The non-light-receiving area section 58 is provided with the date hole 58a corresponding to the date window section 45a of the dial plate 47, as depicted in FIG. 10.

That is, the non-light-receiving area section 58 is provided such that part of its upper side portion is adjacent to side portions of the first and second center cells 78 and 79 on the five o'clock side by portions of the first and second center cells 78 and 79 being cut off, and its main portion is adjacent to two outer-circumferential cells 71 and 77 positioned on the four o'clock side and the six o'clock side.

Accordingly, the light-receiving area of the entire solar panel 46 is area obtained by subtracting the area of the non-light-receiving area section 58 from the area of the entire solar panel 46, as with the third embodiment.

As a result, the first and second center cells 78 and 79 have shapes where a side portion on the five o'clock side has been cut off, as depicted in FIG. 10.

In addition, the two outer-circumferential cells 71 and 77 positioned on the four o'clock side and the six o'clock side have shapes cut along the sides of the non-light-receiving area section 58.

As such, the first center cell 78, the second center cell 79, and the plurality of outer-circumferential cells 71 to 77 are formed such that they have a substantially same light-receiving amount although they have different shapes.

That is, the first center cell 78 and the second center cell 79 are formed such that the light-receiving area of each of the first and second center cells 78 and 79 is larger than the light-receiving area of each of the plurality of outer-circumferential cells 71 to 77 by the approximately average light-shielding area between the maximum and minimum light-shielding areas where the pointers 7 overlap with each of the first and second center cells 78 and 79, as depicted in FIG. 10.

Also, the plurality of outer-circumferential cells 71 to 77 are formed such that they have light-receiving areas of a substantially same size although they have different shapes.

In this embodiment, a through hole 78a is provided in an area on the three o'clock side of the first center cell 78, corresponding to the rotation center of the second functional pointer 43, as depicted in FIG. 10.

In addition, a through hole 79a is provided in an area on the ten o'clock side of the second center cell 79, corresponding to the rotation center of the first functional pointer 42, and a through hole 79b is provided in an area on the seven o'clock side of the second center cell 79, corresponding to the rotation center of the third functional pointer 44.

As a result, although having different shapes, the first and second center cells 78 and 79 of the center cell 70 and the plurality of outer-circumferential cells 71 to 77 are formed such that their light-receiving areas are equal in size, taking into consideration portions shaded by the first to third functional pointers 42 to 44 and portions shaded by the first and second marking sections 42a and 43a and the function display section 44a, as depicted in FIG. 10.

In this solar panel 46 as well, the cells are sequentially connected in series by the plurality of connecting sections 20, as with the first embodiment.

Specifically, these connecting sections 20 are each made of conductive paste, and electrically connect the lower electrode 16 of each cell 71 to 79 and the upper electrode 18 of each cell 71 to 79 adjacent thereto.

In this embodiment as well, among the first and second center cells 78 and 79 and the plurality of outer-circumferential cells 71 to 77, two outer-circumferential cells 72 and 73 positioned at the last end are not connected to each other by the connecting section 20, as depicted in FIG. 10.

The upper electrode 18 of one outer-circumferential cell 72 is connected to the output terminal 20a positioned at its outer-circumferential portion, and the lower electrode 16 of the other outer-circumferential cell 73 is connected to the output terminal 20b positioned at its outer-circumferential portion, as with the first embodiment.

This pair of output terminals 20a and 20b is structured to be connected to a pair of input electrodes (not depicted in the drawings) of the timepiece module 41, as with the first embodiment.

As a result, the solar panel 46 is structured to supply generated electric power to a chargeable battery (not depicted in the drawings) of the timepiece module 41.

Next, the operation of the solar panel 46 in the above-structured pointer-type wristwatch is described. In a normal state, the pointers 7 such as the hour hand 7a, the minute hand 7b, and the second hand 7c are moved above the dial plate 47 by the timepiece movement 5 so as to indicate the time.

In addition, the first functional pointer 42 moves above the first marking section 42a, the second functional pointer 43 moves above the second marking section 43a, and the third functional pointer 44 moves above the function display section 44a.

Here, external light such as sunlight is applied to the dial plate 47, and the applied external light passes through the dial plate 47 to be applied to the cells 71 to 79 of the solar panel 46.

Then, this external light is applied to the power generation layer 17 of each of the cells 71 to 79, and each power generation layer 17 generates electric power by using this applied light, as with the first embodiment. The generated electric power is sent from each of the output terminals 20a and 20b of the outer-circumferential cells 72 and 73 to the chargeable battery (not depicted in the drawings) of the timepiece module 41 for charging.

When the solar panel 46 is generating electric power as described above, in the area above the first and second center cells 78 and 79 among the first and second center cells 78 and 79 of the center cell 70 and the plurality of outer-circumferential cells 71 to 77, the three pointers 7, that is, the hour hand 7a, the minute hand 7b, and the second hand 7c move while being constantly positioned above the first and second center cells 73 and 79. In the area above the outer-circumferential cells 71 to 77, the first to third functional pointers 42 to 44 move while being positioned above the marking sections 42a and 43a and the function display section 44a, as depicted in FIG. 10.

Here, the shapes and sizes of the first and second center cells 78 and 79 of the center cell 70 and the plurality of outer-circumferential cells 71 to 77 have been formed such that the light-receiving areas of the first and second cells 78 and 79 and the plurality of outer-circumferential cells 71 to 77 are substantially equal to each other, taking into consideration the overlap of the pointers 7 and the first to third functional pointers 42 to 44 with the solar panel 46.

Therefore, the light-receiving areas of the first and second center cell 78 and 79 and the plurality of outer-circumferential cells 71 to 77 are substantially equal to each other, even though the non-light-receiving area section 58 has been provided.

As a result, the fluctuations of the light-receiving areas of the first and second center cells 78 and 79 and the plurality of outer-circumferential cells 71 to 77 due to the overlap of the pointers 7 can be minimized, as with the first embodiment.

Accordingly, the light-receiving amounts of all of the first and second center cells 78 and 79 and the plurality of outer-circumferential cells 71 to 77 can be substantially equalized, even though the non-light-receiving area section 58 has been provided.

Consequently, an output current from the entire solar panel 46 is acquired while being stabilized at a high value, irrespective of the non-light-receiving area section 58 and the positions of the pointers 7. That is, the value of current to be outputted from the entire solar panel 46 can be maximized.

As such, in the solar panel 46 of the wristwatch in the fifth embodiment, the center cell 70 has been divided into the first center cell 78 and the second center cell 79 with the through hole 46 as a boundary, and the non-light-receiving area section 58 has been provided that is being surrounded by the center cell 70 and the two outer-circumferential cells 71 and 77 positioned on the four o'clock side and the six o'clock side, among the first center cell 78, second center cell 79, and plurality of outer-circumferential cells 71 to 77.

Accordingly, an antenna for GPS (not depicted in the drawings) can be provided below the non-light-receiving area section 58, as with the third embodiment.

As a result, electric waves can be favorably received by the antenna through the non-light-receiving area section 58.

In this embodiment as well, the solar panel 46 is formed such that the light-receiving area of each of the first center cell 78 and the second center cell 79 is larger than the light-receiving area of each of the plurality of outer-circumferential cells 71 to 77, taking into consideration the light-shielding area where the pointers 7 mounted on the pointer shaft 6 overlap with the first center cell 78 and the second center cell 79.

As a result, even though the non-light-receiving area section 58 is provided, the fluctuation of the light-receiving area of each cell 71 to 79 due to the pointers 7 can be minimized.

Therefore, the light-receiving amounts of the cells 71 to 79 can be substantially equalized, and output currents can be maximally improved.

That is, in this solar panel 46 as well, even though the tips and the rear ends of the pointers 7 always overlap with the first and second center cells 78 and 79 and the tips of the pointers 7 overlaps with one of the plurality of outer-circumferential cells 71 to 77 when the pointers 7 are moving above the first and second center cells 78 and 79 and the plurality of outer-circumferential cells 71 to 77, the fluctuation of each light-receiving area of the first and second center cells 78 and 79 and the plurality of outer-circumferential cells 71 to 77 due to the overlap of the pointers 7 can be minimized.

Therefore, the light-receiving amounts of the first and second center cells 78 and 79 and the plurality of outer-circumferential cells 71 to 77 can be substantially equalized, even though the non-light-receiving area section 58 is provided.

Accordingly, the output current of the cells 71 to 79 as a whole can be stabilized at a high value, irrespective of the positions of the pointers 7. As a result, the output current of the cells 71 to 79 as a whole can be maximally improved.

In this embodiment as well, the first and second center cells 78 and 79 of the center cell 70 are formed such that the light-receiving area of each of the first and second center cells 78 and 79 is larger than the light-receiving area of each of the plurality of outer-circumferential cells 71 to 77 by the approximately average light-shielding area between the maximum and minimum light-shielding areas where the pointers 7 overlap with the first and second center cells 78 and 79.

Therefore, even in the case where the pointers 7 always overlap with the first and second center cells 78 and 79 and the first and second center cells 78 and 79 are light-shielded, the light-receiving amount of each of the first and second center cells 78 and 79 and the light-receiving amount of each of the plurality of outer-circumferential cells 71 to 77 can have a substantially same value.

Accordingly, even when the tip of any of the pointers 7 overlaps with one of the plurality of outer-circumferential cells 71 to 77, the fluctuations of the light-receiving areas of the first and second center cells 78 and 79 and the plurality of outer-circumferential cells 71 to 77 due to this overlap can be minimized.

Therefore, the light-receiving amounts of the first and second center cells 78 and 79 and the plurality of outer-circumferential cells 71 to 77 can be substantially equalized, irrespective of the non-light-receiving area section 58 and the positions of the pointers 7.

Also, regarding this solar panel 46, the shapes and sizes of the cells 71 to 79 are formed such that the light-receiving areas of the first and second center cells 78 and 79 and the plurality of outer-circumferential cells 71 to 77 are substantially equal, taking into consideration the area shaded by the first and second marking sections 42a and 43a and the function display section 44a being provided on the dial plate 47 and the first to third functional pointers 42 to 44 moving above the solar panel 46.

As a result, influences from these first to third functional pointers 42 to 44, the first and second marking sections 42a and 43a, and the function display section 44a can be minimized, and the light-receiving amounts of the first and second center cells 78 and 79 and the plurality of outer-circumferential cells 71 to 77 can be substantially equalized.

In the above-described fifth embodiment, the center cell 70 is divided into two cells such as the first center cell 78 and the second center cell 79 with the through hole 46a at the center of the center cell 70 as a boundary.

However, the present invention is not limited thereto. The center cell 70 may be divided into three or more as long as the number of the divisions is smaller than the number of outer-circumferential cells.

Also, in each of the above-described fourth and fifth embodiments, the non-light-receiving area section 58 of the solar panel 46 is formed only of the film substrate 8, and the film substrate 8 is colored using the same color as that of each cell 60 to 67 and 70 to 77.

However, the present invention is not limited thereto. For example, as in the modification example of the third embodiment depicted in FIG. 8, the non-light-receiving area section 58 may be formed of the notched portion 59 by being cut off along its inner circumference.

Sixth Embodiment

Next, a sixth embodiment of the present invention applied to a pointer-type wristwatch is described with reference to FIG. 11A and FIG. 11B.

In this case as well, sections identical to those of the third embodiment depicted in FIG. 6 and FIG. 7 are provided with the same reference numerals for description.

Figure 11A:
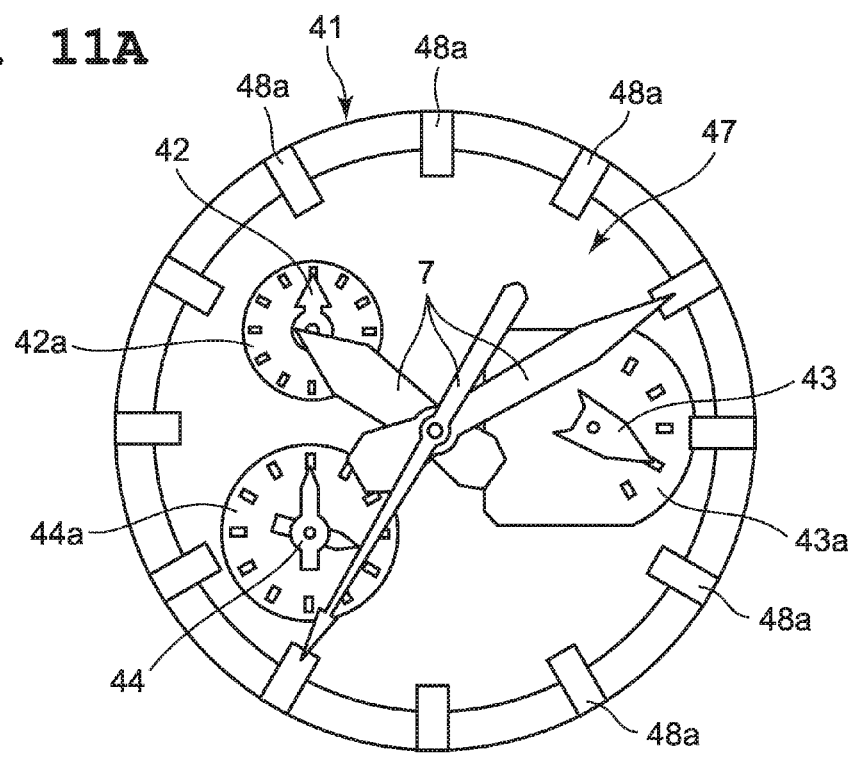
Figure 11B:
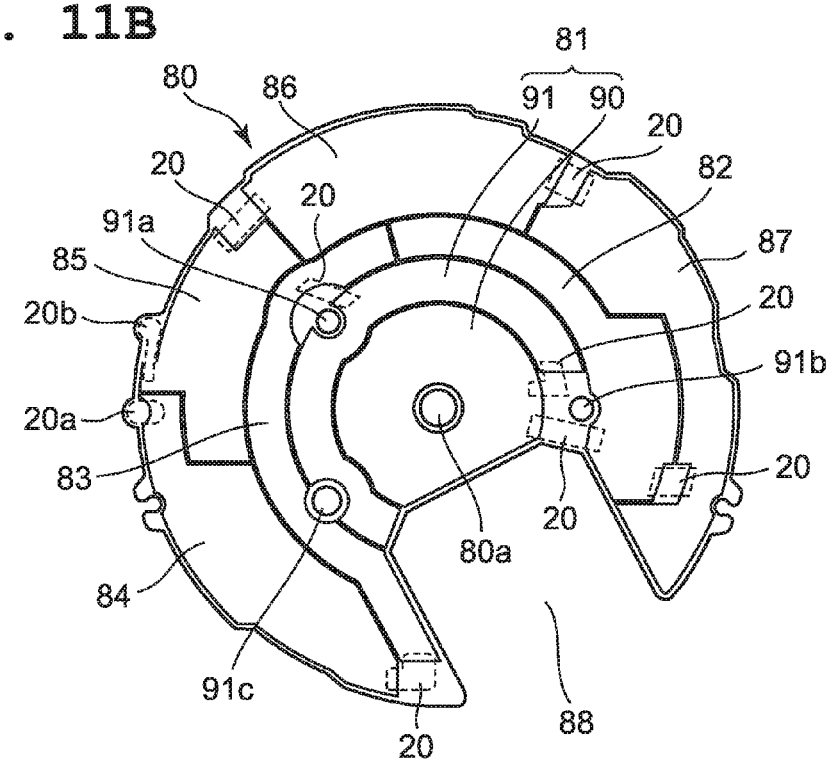

This pointer-type wristwatch is also similar in structure to that of the third embodiment except that a center cell 81 and outer-circumferential cells 82 to 87 in a solar panel 80 have structures different from those of the third embodiment, as depicted in FIG. 11A and FIG. 11B.

In this embodiment, the timepiece module 41 includes the timepiece movement 5 for moving and driving the pointers 7, the first functional pointer 42, the second functional pointer 43, and the third functional pointer 44 (refer to FIG. 1), and an antenna for GPS reception (not depicted in the drawings), as depicted in FIG. 11A.

The timepiece module 41 is structured such that the dial plate 47 is arranged thereabove via the solar panel 80, as with the third embodiment.

The first functional pointer 42, the second functional pointer 43, and the third functional pointer 44 are structured to move above the dial plate 47, as with the third embodiment.

The dial plate 47 is constituted by a transparent or semitransparent film, and has hour characters 48a provided along the circumference in a ring shape.

On the ten o'clock side of the dial plate 47, the first marking section 42a for the first functional pointer 42 is provided in a circular shape.

Also, on the three o'clock side of the dial plate 47, the second marking section 43a for the second functional pointer 43 is provided in a circular shape.

Moreover, on the seven o'clock side of the dial plate 47, the third marking section 44a for the third functional pointer 44 is provided, as depicted in FIG. 11A.

In this embodiment, only necessary portions of the first marking section 42a for the first functional pointer 42, the second marking section 43a for the second functional pointer 43, and the third marking section 44a for the third functional pointer 44 are printed on the dial plate 47. These printed portions slightly shield external light, but other portions allows light to pass through.

The solar panel 80 is formed in a substantially circular shape substantially equal in size to the dial plate 47, as depicted in FIG. 11B.

This solar panel 80 has the center cell 81 formed in a circular shape along the periphery of a through hole 80a provided at the center, the plurality of outer-circumferential cells 82 to 87 formed around the periphery of the center cell 81 and having light-receiving areas of a substantially same size, and a non-light-receiving area section 88 provided corresponding to an antenna for GPS reception (not depicted in the drawings).

In this embodiment, the center cell 81 is divided into a first center cell 90 and a second center cell 91, as depicted in FIG. 11B.

The first center cell 90 is formed along the periphery of the through hole 80a provided at the center of the solar panel 80.

The second center cell 91 is formed along the outer periphery of the first center cell 90.

Also, the plurality of outer-circumferential cells 82 to 87 includes the first and second outer-circumferential cells 82 and 83 which are inner-circumferential-side cells positioned around the periphery of the center cell 81, and the third to sixth outer-circumferential cells 84 to 87 which are outer-circumferential-side cells positioned around the peripheries of the first and second outer-circumferential cells 82 and 83 that are the inner-circumferential-side cells, as depicted in FIG. 11B.

In this embodiment as well, the shapes and sizes of the first center cell 90, the second center cell 91, and the outer-circumferential cells 82 to 87 are formed such that their light-receiving amounts are substantially equal to each other, as depicted in FIG. 11B.

In this case as well, the light-receiving area of each of the first and second center cells 90 and 91 is formed larger than the light-receiving area of each of the plurality of outer-circumferential cells 82 to 87, taking into consideration a light-shielding area where the pointers 7 overlap with each of the first and second center cells 90 and 91.

That is, the light-receiving area of each of the first and second center cells 90 and 91 is formed larger than the light-receiving area of each of the first to sixth outer-circumferential cells 82 to 87 by an approximately average light-shielding area between maximum and minimum light-shielding areas where the pointers 7 overlap with each of the first and second center cells 90 and 91, as depicted in FIG. 11B.

Also, the first to sixth outer-circumferential cells 82 to 87 are formed such that the hour hand 7a of the pointers 7 hardly overlap with each area of the first to sixth outer-circumferential cells 82 to 87, and the tips of the minute hand 7b and the second hand 7c selectively overlap with each area, as depicted in FIG. 11B. Accordingly, their light-receiving areas are substantially equal to each other in size although they have different shapes.

Below the non-light-receiving area section 88, the antenna for GPS reception (not depicted in the drawings) is correspondingly arranged. In order to allow electric waves to easily reach this antenna, the non-light-receiving area section 88 is formed as a notched portion, as depicted in FIG. 11B.

In this embodiment as well, the non-light-receiving area section 88 is formed in a substantially rectangular shape in an area between the four o'clock portion and the six o'clock portion of the solar panel 80, as with the third embodiment.

That is, the non-light-receiving area section 88 is provided such that part of its upper side portion is adjacent to the lower side of the first center cell 90 by a portion of the second center cell 91 being cut off and its main portion is adjacent to side portions of the first to third and sixth outer-circumferential cells 82 to 84 and 87 positioned on the four o'clock side and the six o'clock side, as depicted in FIG. 11B.

Accordingly, the light-receiving area of the entire solar panel 80 is area obtained by subtracting the area of the non-light-receiving area section 88 from the area of the entire solar panel 80, as with the third embodiment.

As a result, the first center cell 90 has a shape where a lower side portion has been cut off as depicted in FIG. 11B.

Also, the second center cell 91 has a shape where a portion between the three o'clock portion and the seven o'clock portion has been cut off.

Moreover, the first to third and sixth outer-circumferential cells 82 to 84 and 87 positioned on the four o'clock side and the six o'clock side have shapes cut along the sides of the non-light-receiving area section 88.

As such, the first center cell 90, the second center cell 91, and the first to sixth outer-circumferential cells 82 to 87 are formed such that they have a substantially same light-receiving amount although they have different shapes.

In this embodiment, a through hole 91a is provided in an area on the ten o'clock side of the second center cell 91, corresponding to the rotation center of the first functional pointer 42, and a through hole 91b is provided in an area on the three o'clock side of the second center cell 91, corresponding to the rotation center of the second functional pointer 43.

In addition, a through hole 91c is provided in an area on the seven o'clock side of the second center cell 91, corresponding to the rotation center of the third functional pointer 44.

As a result, although having different shapes, the first and second center cells 90 and 91 of the center cell 81 and the first to sixth outer-circumferential cells 82 to 87 are formed such that their light-receiving areas are substantially equal in size, taking into consideration portions shaded by the first to third functional pointers 42 to 44 and portions shaded by the first to third marking sections 42a to 44a, as depicted in FIG. 11B.

In this solar panel 80 as well, the cells are sequentially connected in series by the plurality of connecting sections 20, as with the first embodiment.

Specifically, these connecting sections 20 are each made of conductive paste, and electrically connect the lower electrode 16 of each cell 82 to 87, 90, and 91 and the upper electrode 18 of each cell 82 to 87, 90, and 91 adjacent thereto.

In this embodiment, among the plurality of connecting sections 20, connecting sections 20 which connect the third to sixth outer-circumferential cells 84 to 87 on the outer circumferential side and a connecting section 20 which connects the third outer-circumferential cell 84 on the outer circumferential side and the second outer-circumferential cell 83 on the inner circumferential side are provided in areas corresponding to the hour characters 48a of the dial plate 47, as depicted in FIG. 11B.

Also, a connecting section 20 which connects the second outer-circumferential cell 83 on the inner circumferential side and the second center cell 91 are provided in an area near the through hole 91a of the first functional pointer 42.

Moreover, a connecting section 20 which connects the first center cell 90 and the second center cell 91 and a connecting section 20 which connects the first center cell 90 and the first outer-circumferential cell 82 on the inner circumferential side are provided in areas near the through hole 91b of the second functional pointer 43, as depicted in FIG. 11B.

Furthermore, a connecting section 20 which connects the first outer-circumferential cell 82 on the inner circumferential side and the sixth outer-circumferential cell 87 on the outer circumferential side is provided in an area corresponding to the second marking section 43a for the second functional pointer 43.

In this embodiment as well, among the first and second center cells 90 and 91 and the first to sixth outer-circumferential cells 82 to 87, the third and fourth outer-circumferential cells 84 and 85 positioned at the last end are not connected to each other by the connecting section 20, as depicted in FIG. 11B.

The upper electrode 18 of the third outer-circumferential cell 83 is connected to the output terminal 20a positioned at its outer-circumferential portion, and the lower electrode 16 of the fourth outer-circumferential cell 85 is connected to the output terminal 20b positioned at its outer-circumferential portion, as with the first embodiment.

This pair of output terminals 20a and 20b is structured to be connected to a pair of input electrodes (not depicted in the drawings) of the timepiece module 41, as with the first embodiment.

As a result, the solar panel 80 is structured to supply generated electric power to a chargeable battery (not depicted in the drawings) of the timepiece module 41.

Next, the operation of the solar panel 80 in the above-structured pointer-type wristwatch is described.

In a normal state, the pointers 7 such as the hour hand 7a, the minute hand 7b, and the second hand 7c are moved above the dial plate 47 by the timepiece movement 5 so as to indicate the time.

In addition, the first functional pointer 42 moves above the first marking section 42a, the second functional pointer 43 moves above the second marking section 43a, and the third functional pointer 44 moves above the function display section 44a.

Here, external light such as sunlight is applied to the dial plate 47, and the applied external light passes through the dial plate 47 to be applied to the cells 61 to 69 of the solar panel 46.

Then, this external light is applied to the power generation layer 17 of each of the cells 81 to 87, and each power generation layer 17 generates electric power by using this applied light, as with the first embodiment. The generated electric power is sent from each of the output terminals 20a and 20b of the third and fourth outer-circumferential cells 84 and 85 to the chargeable battery (not depicted in the drawings) of the timepiece module 41 for charging.

When the solar panel 80 is generating electric power as described above, in the area above the first and second center cells 90 and 91 among the first and second center cells 90 and 91 of the center cell 81 and the first to sixth outer-circumferential cells 82 to 87, the three pointers 7, that is, the hour hand 7a, the minute hand 7b, and the second hand 7c move while being constantly positioned above the first and second center cells 90 and 91. In the area above the first to sixth outer-circumferential cells 82 to 87, the first to third functional pointers 42 to 44 move while being positioned above the first to third marking sections 42a to 44a, as depicted in FIG. 11B.

Here, the shapes and sizes of the first and second center cells 90 and 91 of the center cell 81 and the first to sixth outer-circumferential cells 82 to 87 have been formed such that the light-receiving areas of the first and second center cells 90 and 91 and the first to sixth outer-circumferential cells 82 to 87 are substantially equal to each other, taking into consideration the overlap of the pointers 7 and the first to third functional pointers 42 to 44 with the solar panel 80.

Therefore, the light-receiving areas of the first and second center cells 90 and 91 and the first to sixth outer-circumferential cells 82 to 87 are substantially equal to each other, even though the non-light-receiving area section 88 has been provided.

As a result, the fluctuations of the light-receiving areas of the first and second center cells 90 and 91 and the first to sixth outer-circumferential cells 82 to 87 due to the overlap of the pointers 7 can be minimized, as with the first embodiment. Accordingly, the light-receiving amounts of all of the first and second center cells 90 and 91 and the first to sixth outer-circumferential cells 82 to 87 can be substantially equalized, even though the non-light-receiving area section 88 has been provided.

Consequently, an output current from the entire solar panel 80 is acquired while being stabilized at a high value, irrespective of the non-light-receiving area section 88 and the positions of the pointers 7. That is, the value of current to be outputted from the entire solar panel 80 can be maximized.

As such, in the solar panel 80 for the wristwatch in the sixth embodiment, the center cell 81 has been divided into the first center cell 90 formed along the periphery of the through hole 80a and the second center cell 91 formed along the periphery of the first center cell 90, and the plurality of outer-circumferential cells 82 to 87 have been grouped into the first and second outer-circumferential cells 82 and 83 on the inner circumferential side positioned around the outer periphery of the center cell 81 and the third to sixth outer-circumferential cells 84 to 87 on the outer circumferential side positioned around the outer periphery of the first and second outer-circumferential cells 82 and 83 on the inner circumferential side. The light-receiving amounts of these cells, that is, the light-receiving amounts of the first center cell 90, the second center cell 91, and the first to sixth outer-circumferential cells 82 to 87 can be substantially equalized. Accordingly, output currents can be maximally improved.

In this case, in the solar panel 80, the light-receiving area of each of the first and second center cells 90 and 91 has been formed larger than the light-receiving area of each of the first to sixth outer-circumferential cells 82 to 87, taking into consideration the light-shielding area where the pointers 7 mounted on the pointer shaft 6 overlap with the first center cell 90 and the second center cell 91.

As a result, the fluctuation of the light-receiving area of each cell 82 to 87, 90, and 91 due to the pointers 7 can be minimized.

Therefore, the light-receiving amounts of the cells 82 to 87, 90, and 91 can be substantially equalized, and output currents can be maximally improved.

Also, in this solar panel 80, the plurality of outer-circumferential cells 82 to 87 have been grouped into the first and second outer-circumferential cells 82 and 83 on the inner circumferential side positioned around the outer periphery of the center cell 81 and the third to sixth outer-circumferential cells 84 to 87 on the outer circumferential side positioned around the outer periphery of the first and second outer-circumferential cells 82 and 83 on the inner circumferential side, and the light-receiving areas of these cells are substantially equal in size.

Therefore, the light-receiving amounts of the first to sixth outer-circumferential cells 82 to 87 can be substantially equalized.

That is, even when part of the pointers 7 overlaps with one of the first to sixth outer-circumferential cells 82 to 87, the fluctuations of the light-receiving areas of the first and second center cells 90 and 91 and the first to sixth outer-circumferential cells 82 to 87 due to this overlap can be minimized.

Therefore, the light-receiving amounts of the first and second center cells 90 and 91 and the first to sixth outer-circumferential cells 82 to 87 can be substantially equalized, irrespective of the non-light-receiving area section 88 and the positions of the pointers 7.

Regarding this solar panel 80, the light-receiving amounts of the first and second center cells 90 and 91 and the first to sixth outer-circumferential cells 82 to 87 can be substantially equalized by the light-receiving areas of the first and second center cells 90 and 91 and the first to sixth outer-circumferential cells 82 to 87 being substantially equalized taking into consideration the area shaded by the first to third marking sections 42a to 44a being provided to the dial plate 47 and the first to third functional pointers 42 to 44 moving above the solar panel 80.

That is, the shapes and sizes of the first and second center cells 90 and 91 and the first to sixth outer-circumferential cells 82 to 87 are formed such that the light-receiving areas of the cells 82 to 87, 90, and 91 are substantially equal, taking into consideration the area of the solar panel 80 shaded by the first to third functional pointers 42 to 44 moving above the solar panel 80 and the first to third marking sections 42a to 44a provided to the dial plate 47.

As a result, influences from the first to third functional pointers 42 to 44 and the first to third marking sections 42a to 44a can be minimized, and the light-receiving amounts of the first and second center cells 90 and 91 and the first to sixth outer-circumferential cells 82 to 87 can be substantially equalized.

Accordingly, output currents can be maximally improved.

Also, in this solar panel 80, the non-light-receiving area section 88 has been provided that is being surrounded by the center cell 81 and, among all of the cells 82 to 87, 90, and 91, the first to third and sixth outer-circumferential cells 82 to 84 and 87 on the four o'clock side and the six o'clock side.

Accordingly, an antenna for GPS (not depicted in the drawings) can be provided below the non-light-receiving area section 88, as with the third embodiment. As a result, electric waves can be favorably received by the antenna through the non-light-receiving area section 88.

That is, regarding this solar panel 80, the number of cells can be increased more than the third embodiment, as the cells 82 to 87, 90, and 91. Therefore, even if an antenna for GPS is incorporated and the battery voltage is increased, a sufficient output current can be acquired.

In this case, in order to ensure the antenna's sensitivity, the light-receivable area of the entire solar panel 80 is narrowed by the non-light-receiving area section 88 approximately by ¼.

Therefore, adverse effects by the shade of the pointers 7 are significantly large especially when the pointers 7 are large. However, in the present embodiment, since the number of cells can be increased, the electric power generation amount can be improved by approximately 1.6 fold.

Note that, although the non-light-receiving area section 88 of the solar panel 80 is formed as a notched portion in the above-described sixth embodiment, a structure may be adopted in which the non-light-receiving area section 88 is formed only of a film substrate, and the film substrate is colored using the same color as that of each cell 82 to 87, 90, and 91.

Seventh Embodiment

Next, a seventh embodiment of the present invention applied to a pointer-type wristwatch is described with reference to FIG. 12A and FIG. 12B.

In this case, sections identical to those of the sixth embodiment depicted in FIG. 11A and FIG. 11B are provided with the same reference numerals for description.

Figure 12A:
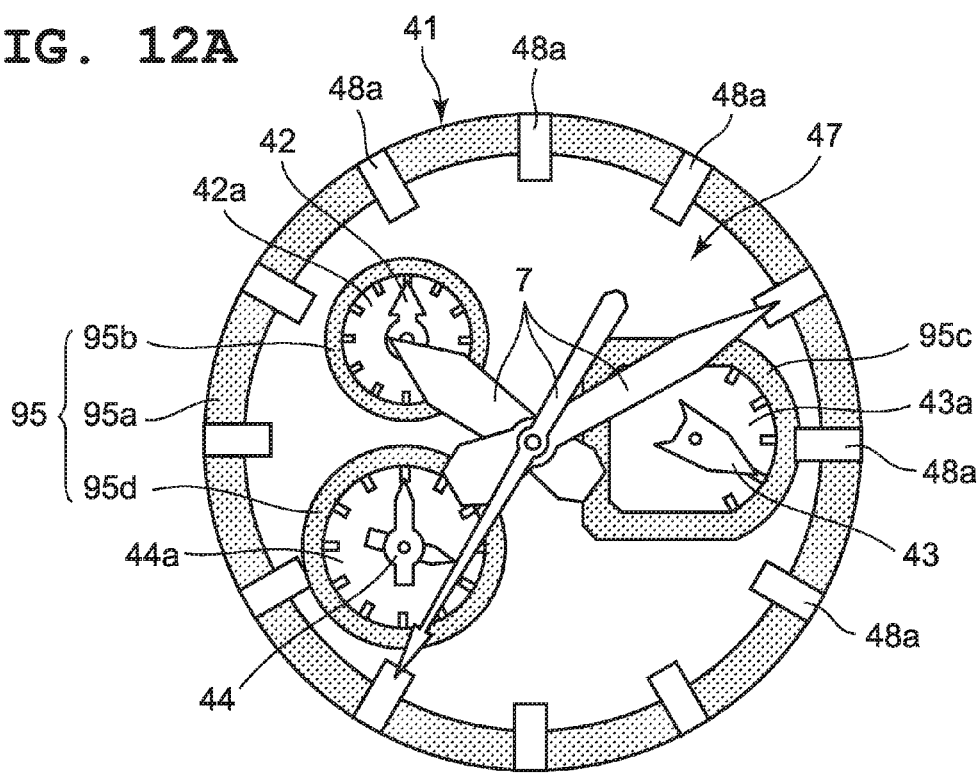
Figure 12B:
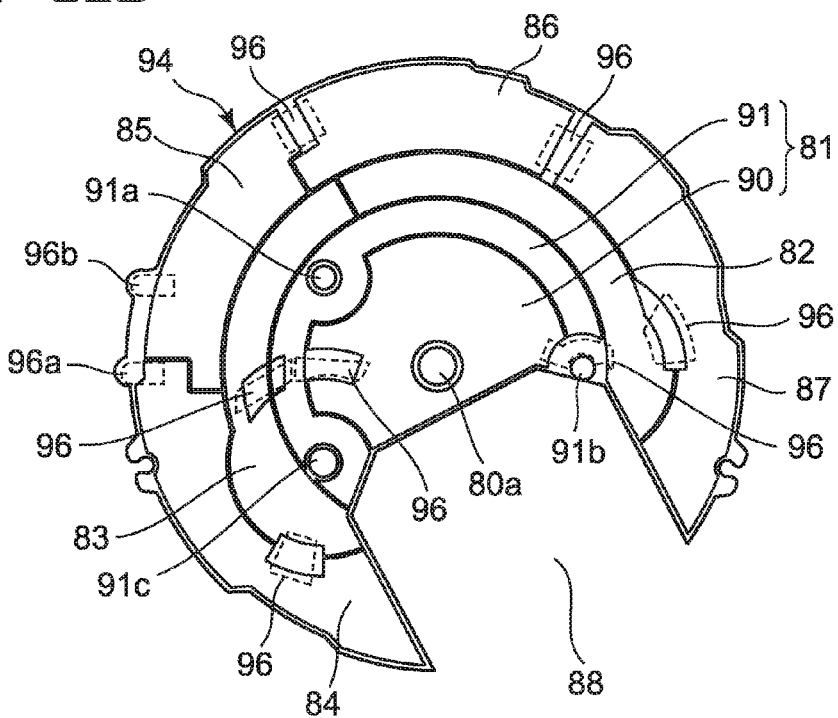

This pointer-type wristwatch is similar in structure to that of the sixth embodiment except that a parting section 95 is provided on the dial plate 47, and the shapes of the first and second center cells 90 and 91 of the center cell 81 and the first to sixth outer-circumferential cells 82 to 87 in the solar panel 94 are different to suit the parting section 95, as depicted in FIG. 12A and FIG. 12B.

In this embodiment, the parting section 95 includes a first parting section 95a provided on the outer circumference of the dial plate 47, a second parting section 95b provided on the outer circumference of the first marking section 42a of the first functional pointer 42, a third parting section 95c provided on the outer circumference of the second marking section 43a of the second functional pointer 43, a fourth parting section 95d provided on the outer circumference of the third marking section 44a of the third functional pointer 44, as depicted in FIG. 12A.

These first to fourth parting sections 95a to 95d are layers with light transmittance lower than that of the dial plate 47, such as metal plating layers, metal-evaporated layers, or printed layers.

Accordingly, the first and second center cells 90 and 91 of the center cell 81 and the first to sixth outer-circumferential cells 82 to 87 in the solar panel 94 have shapes whose boundaries have been formed to suit the first to fourth parting sections 95a to 95d, as depicted in FIG. 12B.

That is, the third to sixth outer-circumferential cells 84 to 87 on the outer circumferential side corresponding to the first parting section 95a positioned on the outer circumference of the dial plate 47 are formed such that each of their areas is wider than the area of each of the first and second outer-circumferential cells 82 and 83 on the inner circumferential side, taking into consideration light-shielding by the first parting section 95a.

As a result, the third to sixth outer-circumferential cells 84 to 87 on the outer circumferential side are formed such that each of their light-receiving areas is substantially equal to the area of each of the first and second outer-circumferential cells 82 and 83 on the inner circumferential side.

Also, the second center cell 91 on the outer circumferential side of the center cell 81 corresponding to the second parting section 95b provided on the outer circumference of the first marking section 42a of the first functional pointer 42 is formed into a shape whose portion corresponding to the second parting section 95b is extending into the first center cell 90 on the inner circumferential side, taking into consideration light-shielding by the second parting section 95b.

As a result, the second center cell 91 on the outer circumferential side is formed such that its light-receiving area is substantially equal to the light-receiving area of the first center cell 90 on the inner circumferential side.

Also, the first outer-circumferential cell 82 on the inner circumferential side corresponding to the third parting section 95c provided on the outer circumference of the second marking section 43a of the second functional pointer 43 is formed into a shape whose portion corresponding to the third parting section 95c is extending into the sixth outer-circumferential cell 87 on the outer circumferential side, taking into consideration light-shielding by the third parting section 95c.

As a result, the first outer-circumferential cell 82 on the inner circumferential side is formed such that its light-receiving area is substantially equal to the light-receiving area of the sixth outer-circumferential cell 87 on the outer circumferential side.

Also, the second outer-circumferential cell 83 on the inner circumferential side corresponding to the fourth parting section 95d provided on the outer circumference of the third marking section 44a of the third functional pointer 44 is formed into a shape whose portion corresponding to the fourth parting section 95d is extending into the third outer-circumferential cell 84 on the outer circumferential side, taking into consideration light-shielding by the fourth parting section 95d.

As a result, the second outer-circumferential cell 82 on the inner circumferential side is formed such that its light-receiving area is substantially equal to the light-receiving area of the third outer-circumferential cell 84 on the outer circumferential side.

Similarly, the second center cell 91 on the outer circumferential side corresponding to the fourth parting section 95d provided on the outer circumference of the third marking section 44a of the third functional pointer 44 is formed into a shape whose portion corresponding to the fourth parting section 95d is extending into the first center cell 90 on the inner circumferential side, taking into consideration light-shielding by the fourth parting section 95d.

As a result, the second center cell 91 on the outer circumferential side is formed such that its light-receiving area is substantially equal to the light-receiving area of the first center cell 90 on the inner circumferential side.

In this solar panel 94 as well, the cells are sequentially connected in series by the plurality of connecting sections 96, as with the sixth embodiment.

Specifically, these connecting sections 96 are each made of conductive paste, and electrically connect the lower electrode 16 of each cell 82 to 87, 90, and 91 and the upper electrode 18 of each cell 82 to 87, 90, and 91 adjacent thereto.

In this embodiment, these connecting sections 96 are provided corresponding to the respective parting sections 95, as depicted in FIG. 12B.

That is, connecting sections 96 which connect the fourth to sixth outer-circumferential cells 85 to 87 on the outer circumferential side are provided corresponding to portions below the first parting section 95a positioned on the outer circumference of the dial plate 47.

Also, a connecting section 96 which connects the sixth outer-circumferential cell 87 on the outer circumferential side and the first outer-circumferential cell 82 on the inner circumferential side is provided corresponding to a portion below the third parting section 95c positioned on the outer circumference of the second marking section 43a for the second functional pointer 43.

Moreover, a connecting section 96 which connects the third outer-circumferential cell 84 on the outer circumferential side and the second outer-circumferential cell 83 on the inner circumferential side, and a connecting section 96 which connects the second outer-circumferential cell 83 on the inner circumferential side and the second center cell 91 on the outer circumferential side are provided corresponding to portions below the fourth parting section 95d positioned on the outer circumference of the third marking section 44a for the third functional pointer 44.

A connecting section 96 which connects the first center cell 90 on the inner circumferential side and the first outer-circumferential cell 82 on the inner circumferential side is provided to be positioned below the second marking section 43a for the second functional pointer 43 and near the through hole 91b.

In this embodiment as well, among the first and second center cells 90 and 91 and the first to sixth outer-circumferential cells 82 to 87, the third and fourth outer-circumferential cells 84 and 85 positioned at the last end are not connected to each other by the connecting section 96, as depicted in FIG. 12B.

The upper electrode 18 of the third outer-circumferential cell 84 is connected to an output terminal 96a positioned at its outer-circumferential portion, and the lower electrode 16 of the fourth outer-circumferential cell 85 is connected to an output terminal 96b positioned at its outer-circumferential portion, as with the first embodiment.

This pair of output terminals 96a and 96b is structured to be connected to a pair of input electrodes (not depicted in the drawings) of the timepiece module 41, as with the first embodiment.

As a result, the solar panel 94 is structured to supply generated electric power to the chargeable battery (not depicted in the drawings) of the timepiece module 41.

By this solar panel 94 of the seventh embodiment as well, operations and effects similar to those of the sixth embodiment can be achieved. In addition, by the parting section 95 being provided on the front surface side of the solar panel 94, a product having high decorativeness and favorable design can be provided.

Also, since the connecting sections 96 which connect the first and second center cells 90 and 91 of the center cell 81 and the first to sixth outer-circumferential cells 82 to 87 in series are provided corresponding to the parting section 95, each connecting section 96 can be hidden so as not to be viewed from outside, and a decrease in light-receiving area due to each connecting section 96 can be prevented.

That is, the parting section 95 includes the first parting section 95a provided on the outer circumference of the dial plate 47, the second parting section 95b provided on the outer circumference of the first marking section 42a of the first functional pointer 42, the third parting section 95c provided on the outer circumference of the second marking section 43a of the second functional pointer 43, and the fourth parting section 95d provided on the outer circumference of the third marking section 44a of the third functional pointer 44, Therefore, a product having high decorativeness and favorable design can be provided.

In this embodiment the boundaries of the first and second center cells 90 and 91 of the center cell 81 and the first to sixth outer-circumferential cells 82 to 87 are formed to suit the parting section 95. Therefore, the light-receiving areas of the cells 82 to 87, 90, and 91 can be substantially equalized, taking into consideration the light-shielding area of each of the cells 82 to 87, 90, and 91 overlapping with the parting section 95.

That is, by the shapes and sizes of each of the cells 82 to 87, 90, and 91 being set, the light-receiving amounts of the first and second center cells 90 and 91 and the first to sixth outer-circumferential cells 82 to 87 can be substantially equalized.

In the above-described seventh embodiment, the non-light-receiving area section 88 of the solar panel 94 is formed as a notched portion. However, a structure may be adopted in which the non-light-receiving area section 88 is formed only of a film substrate, and the film substrate is colored using the same color as that of each cell 82 to 87, 90, and 91.

Also, in each of the above-described first to seventh embodiments and their modification examples, the plurality of outer-circumferential cells 11 to 15, 28 to 32, 51 to 57, 61 to 67, 71 to 77, and 82 to 87 are radially formed around the outer periphery of the center cells 10, 27, 50, 60, 70, and 81, respectively. However, the present invention is not limited thereto. For example, the plurality of outer-circumferential cells 11 to 15, 28 to 32, 51 to 57, 61 to 67, 71 to 77, and 82 to 87 may be formed in a spiral shape or in a concentric shape (ring shape).

Moreover, in each of the above-described first to seventh embodiments and their modification examples, five or six outer-circumferential cells 11 to 15, 28 to 32, 51 to 57, 61 to 67, 71 to 77, and 82 to 87 are formed around the outer periphery of of the center cells 10, 27, 50, 60, 70, and 81, respectively. However, the number of outer-circumferential cells provided is not necessarily five or six, and may be seven or more.

Furthermore, in each of the above-described third to seventh embodiments and their modification examples, the non-light-receiving area section 58 or 88 or the notched portion 59 is provided. However, the solar panel may have a circular shape, and a center cell and a plurality of outer-circumferential cells may be arranged over the entire solar panel, as in the first embodiment.

Still further, in each of the above-described first to seventh embodiments and their modification examples, the present invention is applied to a pointer-type wristwatch. However, the present invention is not necessarily required to be applied to a wristwatch, and may be widely applied to various pointer-type timepieces such as a travel watch, an alarm clock, a desk clock, and a wall clock, and to pointer-type measuring instruments such as a meter.

This application is used upon and claims the benefit of priority from Japanese patent application No. 2014-050244, filed Mar. 13, 2014 and No. 2013-182755, filed Sep. 4, 2013, the entire contents of which are incorporated herein by reference.

While the present invention has been described with reference to the preferred embodiments, it is intended that the invention be not limited by any of the details of the description therein but includes all the embodiments which fall within the scope of the appended claims.

The invention claimed is:

1. A solar panel where a pointer shaft is inserted into a through hole provided at center of the solar panel and pointers mounted on the pointer shaft move above the solar panel, comprising:
　a center cell formed around periphery of the through hole; and
　a plurality of outer-circumferential cells formed around outer periphery of the center cell in a manner to have substantially same light-receiving areas,
　　wherein the center cell is formed to have a light-receiving area larger than each light-receiving area of the plurality of outer-circumferential cells, taking into consideration a light-shielding area where the pointers overlap with the center cell.

2. The solar panel according to claim 1, wherein the light-shielding area where the pointers overlap with the center cell is an approximately average light-shielding area between a maximum light-shielding area and a minimum light-shielding area due to the pointers.

3. The solar panel according to claim 1, wherein a non-light-receiving area surrounded by at least one of the center cell and the plurality of outer-circumferential cells is provided.

4. The solar panel according to claim 1, wherein the center cell includes a first center cell formed along periphery of the through hole and a second center cell formed along outer periphery of the first center cell.

5. The solar panel according to claim 1, wherein the center cell is divided into a plural number less than number of the plurality of outer-circumferential cells, with the center of the solar panel as a boundary.

6. The solar panel according to claim 1, wherein the plurality of outer-circumferential cells includes a plurality of outer-circumferential cells on an inner circumferential side positioned around outer periphery of the center cell and a plurality of outer-circumferential cells on an outer circumferential side positioned around outer periphery of the plurality of outer-circumferential cells on the inner circumferential side.

7. The solar panel according to claim 1, wherein the center cell and the plurality of outer-circumferential cells are connected in series by connecting sections.

8. The solar panel according to claim 1, wherein parting sections are provided on a front surface side of the solar panel, and the connecting sections which connect the center cell and the plurality of outer-circumferential cells in series are provided corresponding to the parting sections.

9. The solar panel according to claim 8, wherein boundaries of the center cell and the plurality of outer-circumferential cells are formed to suit the parting section.

10. A timepiece comprising:
　a solar panel where a pointer shaft is inserted into through hole provided at center of the solar panel and pointers mounted on the pointer shaft move above the solar panel, wherein the solar panel includes a center cell formed around periphery of the through hole, and a plurality of outer-circumferential cells formed around outer periphery of the center cell in a manner to have substantially same light-receiving areas, and wherein the center cell is formed to have a light-receiving area larger than each light-receiving area of the plurality of outer-circumferential cells, taking into consideration a light-shielding area where the pointers overlap with the center cell.

* * * * *